(12) United States Patent
France

(10) Patent No.: US 7,743,203 B2
(45) Date of Patent: Jun. 22, 2010

(54) MANAGING FLASH MEMORY BASED UPON USAGE HISTORY

(75) Inventor: Robert Brent France, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 247 days.

(21) Appl. No.: 11/747,608

(22) Filed: May 11, 2007

(65) Prior Publication Data

US 2008/0279005 A1     Nov. 13, 2008

(51) Int. Cl.
*G11C 16/00*     (2006.01)
*G11C 16/14*     (2006.01)
*G11C 16/32*     (2006.01)
*G11C 16/34*     (2006.01)

(52) U.S. Cl. ............... 711/103; 365/185.29; 365/185.3; 365/185.33

(58) Field of Classification Search .................. 711/103; 365/185.29, 185.3, 185.33

See application file for complete search history.

(56) References Cited

U.S. PATENT DOCUMENTS

| | | | |
|---|---|---|---|
| 6,028,794 A * | 2/2000 | Nakai et al. ............ | 365/185.29 |
| 6,081,447 A | 6/2000 | Lofgren et al. | |
| 6,104,638 A * | 8/2000 | Larner et al. ........... | 365/185.33 |
| 6,714,458 B2 * | 3/2004 | Gualandri et al. ...... | 365/185.29 |
| 6,973,531 B1 | 12/2005 | Chang et al. | |
| 7,035,967 B2 | 4/2006 | Chang et al. | |
| 2006/0203546 A1 | 9/2006 | Lasser | |
| 2007/0033332 A1 * | 2/2007 | Sinclair et al. ............. | 711/103 |
| 2007/0180328 A1 * | 8/2007 | Cornwell et al. ............ | 714/42 |

* cited by examiner

*Primary Examiner*—Brian R Peugh
*Assistant Examiner*—Nicholas Simonetti
(74) *Attorney, Agent, or Firm*—Turocy & Watson, LLP

(57) ABSTRACT

A memory management component can track the amount of time between erase cycles for a particular memory region, and can manage memory region such that the regions are given sufficient time to rest and recover, or are given at least as much rest time as is practical, before being subject to an erase cycle. A reclamation management component can reclaim memory region that have invalid data stored therein, and can reclaim regions on a just-in-time basis when practical, and can determine which regions to reclaim based on various factors, such as the amount of time since a region was last erased, and the number of programming errors associated with a region. The memory management component can thereby optimize the useful life, minimize or reduce loss of margin in memory regions, and minimize or reduce programming errors of memory regions, of non-volatile (e.g., flash) memory.

20 Claims, 13 Drawing Sheets

MANAGING FLASH MEMORY BASED UPON USAGE HISTORY

BACKGROUND

A wide variety of memory devices can be used to maintain and store data and instructions for various computers and similar systems. In particular, flash memory is a type of electronic memory media that can be rewritten and that can retain content without consumption of power. Unlike dynamic random access memory (DRAM) devices and static random memory (SRAM) devices in which a single byte can be erased, flash memory devices are typically erased in fixed multi-bit blocks or sectors. Flash memory technology can include NOR flash and NAND flash, for example. NOR flash evolved from electrically erasable read only memory (EEPROM) chip technology, in which, unlike flash, a single byte can be erased; and NAND flash evolved from DRAM technology. Flash memory devices are less expensive and denser as compared to many other memory devices, meaning that flash memory devices can store more data per unit area.

Flash memory has become popular, at least in part, because it combines the advantages of the high density and low cost of EPROM with the electrical erasability of EEPROM. Flash memory is nonvolatile; it can be rewritten and can hold its content without power. It is used in many portable electronic products, such as cell phones, portable computers, voice recorders, thumbnail drives and the like, as well as in many larger electronic systems, such as cars, planes, industrial control systems, etc. The fact that flash memory can be rewritten, as well as its retention of data without a power source, small size, and light weight, have all combined to make flash memory devices useful and popular means for transporting and maintaining data.

While flash memory has certain advantages, there is a desire to improve the lifetime of flash memory devices, as flash memory blocks or sectors can be subject to failure or programming errors after a certain number of cycles. Further, it is desirable to reduce the loss of margin in the cells of an erase block during erase operations, as reducing margin loss can extend the use of the flash memory as well as reduce programming errors in flash memory.

SUMMARY

The following presents a simplified summary of the subject innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The subject innovation relates to systems and/or methods for optimizing the useful life, minimizing or reducing loss of margin, and minimizing or reducing programming errors, of non-volatile memory devices (e.g., flash memory). In one aspect of the disclosed subject matter, a system for optimizing the number of erase cycles (e.g., life expectancy) that can be performed on memory regions (e.g., blocks, sectors) in a non-volatile memory device is presented wherein a cycle interval management component can manage memory regions so that the memory regions can be rested between erase cycles until such regions have recovered, or have at least rested for a period of time, before being subject to another erase cycle. The desired amount of rest time to optimize the useful life of the memory device can vary based on certain factors, such the temperature at which the memory operates, for example.

To track the time between erase cycles for a memory region, a timer component can be employed that can include a monotonically increasing timer that can indicate the amount of powered time that has passed since the last erase cycle for the memory region, and the length of such powered time can be recorded. In determining an estimated period of time that a memory region has been resting, the amount of powered time can be normalized to account for periods of time that the memory or device associated therewith is not powered on. In another aspect, a time stamp can be utilized to determine the time that a memory region was erased and such information can be stored in memory and utilized to facilitate determining when an erased memory region is recovered and/or determining the amount of rest a memory region has received. Information regarding the recovery or rest associated with a memory region can be utilized in making determination as to when the region may be used (e.g., write operation) again and/or when the region may be subjected to an erase cycle, in accordance with the desire to minimize wear on and optimize the performance of the memory region.

In another aspect of the disclosed subject matter, a memory management component can account for instances where it is not practical or efficient to allow memory regions to rest until recovered. In certain cases, when a sufficient number of recovered memory regions are not available to meet the demands on the memory (e.g., write operation that demands more recovered memory regions than are available), the memory management component can facilitate making available memory regions that have not recovered yet, such as regions that are resting (e.g., "well rested" memory regions), based on certain criteria, where such criteria can be related to an amount of rest a particular memory region has had since its last erase cycle, and/or a number of programming errors associated with the particular memory region, for example.

In another aspect, the disclosed subject matter can include an error count component that can track the number of programming errors associated with a particular memory region. The number of programming errors associated with a memory region can be stored in memory, and information regarding the error count can be utilized in determining which memory region to place (e.g., write) incoming data to in the memory device and/or which memory region to reclaim, for example.

In yet another aspect, the disclosed subject matter can manage wear leveling of memory regions by managing how memory regions that have invalid data stored therein are reclaimed. Memory region reclamation (e.g., garbage collection) can be managed so as to balance the desire to allow memory regions to recover, or at least rest as much as possible, between erase cycles to maintain or reduce wear on the memory regions, and the desire to have operations (e.g., write) to access data to/from the memory regions performed efficiently.

A reclamation management component can employ Just-In-Time (JIT) garbage collection, for example, and can determine when to perform JIT garbage collection to reclaim memory regions as well as determine which memory regions to reclaim. Determining when to perform JIT garbage collection and which regions to reclaim can be based on various factors, such as, for example, the occupancy level of the memory, whether a particular memory region is recovered, well rested, or has just been subject to an erase cycle; the number of programming errors associated with a particular memory region; and/or the amount of invalid data (or conversely, the amount of valid data) stored within a particular memory region. Background garbage collection can also be employed to reclaim memory regions with invalid data stored therein, so as to take advantage of powered idle time of the memory. Furthermore, on-demand garbage collection can be employed where garbage collection can be started, stopped, and otherwise controlled by a user, for example.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
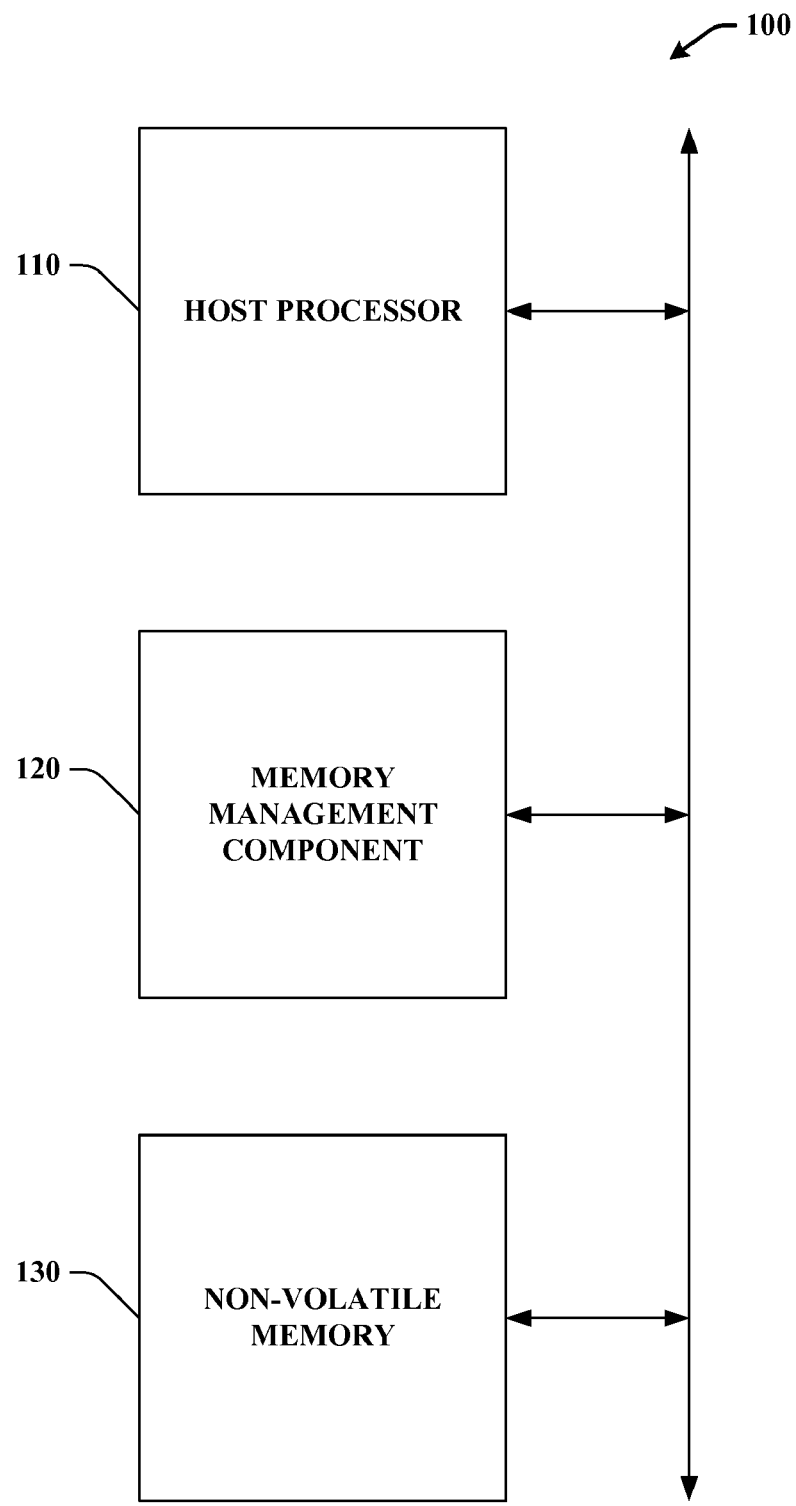
FIG. 1 illustrates a system that facilitates management of wear leveling of memory in accordance with an aspect of the subject matter disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

It is desirable to improve the lifetime of non-volatile memory devices (e.g., flash memory), as memory blocks with the non-volatile memory can be subject to failure after a certain number of cycles. Further, it is desirable to reduce the loss of margin in the cells of an erase block or sector during erase cycles, as reducing margin loss can extend the use of the non-volatile memory as well as reduce programming errors in the non-volatile memory.

Systems and methods that facilitate memory management are presented. A memory management component can be employed to optimize the useful life, minimize or reduce loss of margin in memory regions (e.g., blocks for a NAND flash memory, sectors for a NOR flash memory), and minimize or reduce programming errors of memory regions, of non-volatile (e.g., flash) memory. The memory management component can include a cycle interval management component to track the amount of time between erase cycles for a particular memory region, and the memory management component manages the memory regions such that the regions are given sufficient time to rest to recover, or are given at least as much rest time as is practical, before being subject to an erase cycle. Further, memory regions that have invalid data stored therein can be reclaimed in such a manner as to, when possible, reclaim regions on a just-in-time basis, reclaim recovered regions before those regions that have not recovered yet, and/or to reclaim regions with low numbers of programming errors before those regions with higher numbers of programming errors, for example.

Now turning to the figures, FIG. 1 depicts a system 100 that facilitates management of memory in accordance with the disclosed subject matter. System 100 can include a host processor 110 that can be associated with a memory management component 120 that can facilitate management of wear leveling of a memory device 130 associated therewith via a bus. The host processor 110 can be a typical applications processor that can manage communications and run applications. For example, the host processor 110 can be a processor utilized by a computer, a mobile handset, personal data assistant (PDA), or other electronic device. The memory device 130 can be non-volatile memory, such as flash memory, for example. It is to be appreciated that system 100 can include other components (e.g., random access memory (RAM), interfaces, etc.), which are not shown.

Memory management component 120 can facilitate management of data placement in memory regions in memory device 130. The memory management component 120 can employ various types of data placement (e.g., wear leveling) techniques and/or mechanisms to minimize or reduce the wear on memory regions in memory 130. For example, memory management component 120 can facilitate performing "peanut butter" wear leveling, which is akin to "data striping," where data can be "striped" through memory regions, such that, during a write operation, a first piece of data can be written to a first memory region, a second piece of data can be written to a second memory region, a third piece of data can be written to a third memory region, etc. Further, "in order" wear leveling can be performed, where pieces of data can be placed (e.g., written) in memory regions in order such that the pieces of data can be written to a memory region until the region is filled before writing to another region.

Furthermore, memory management component 120 can manage erase cycles with regard to the memory regions such that a memory region can be given sufficient time to rest and recover between erase cycles, as discussed more fully below, so as to optimize the useful life of the memory region, minimize loss of margin in the memory region, and minimize programming errors in that memory region. The memory management component 120 can also track the number of programming errors associated with each memory region in memory 130, and such information can be utilized when determining which memory regions to write incoming data.

Memory management component 120 can also reclaim memory regions that have invalid or no valid data stored therein. For example, where a memory region has some valid data, but also contains outdated or otherwise invalid data (e.g., memory region has "dirty" space), the valid data can be written to another region and the memory region erased, and the invalid data can be discarded. The memory region thereby can be reclaimed to be made available again. A decision as to which memory region to reclaim can be based on various factors, such as the length of time since an erase cycle was performed on the memory region, and the number of programming errors associated with the memory region.

At certain times, it may be desirable to perform a just-in-time (JIT) reclamation (e.g., garbage collection, forward garbage collection) that is "forced" in order to reclaim memory regions, such as when there are insufficient regions available to perform a write operation. In such instances, memory management component 120 can reclaim a memory region(s) that is more rested (e.g., "well rested" memory region) than another memory region(s), for example. Further, if no memory regions have rested to the point so as to be considered well rested or more rested (e.g., region that is below a predetermined threshold amount of rest time to be considered well rested), then the memory management component 120 can reclaim memory regions with a low number of errors, such as memory regions that have a number of programming errors below a predetermined threshold value, for example. Moreover, if no well-rested regions or low-error regions are available to be reclaimed, the memory management component 120 can select and reclaim memory regions that have a low amount of valid data stored therein (e.g., "least occupied" memory region or, conversely, "most dirty" memory region).

In another aspect of the disclosed subject matter, the memory management component 120 can also facilitate maintaining a burst pool of memory regions, where such regions can include recovered memory regions, or if desired, "well rested" memory regions. The memory regions in the burst pool can be utilized when an operation, such as a write operation, is to be performed and there are not sufficient memory regions in the available pool of memory regions, for example. Memory regions from the burst pool can be utilized for the write operation, and the burst pool can later be replenished to a desired level (e.g., predetermined threshold level) when other memory regions are reclaimed.

Figure 2:
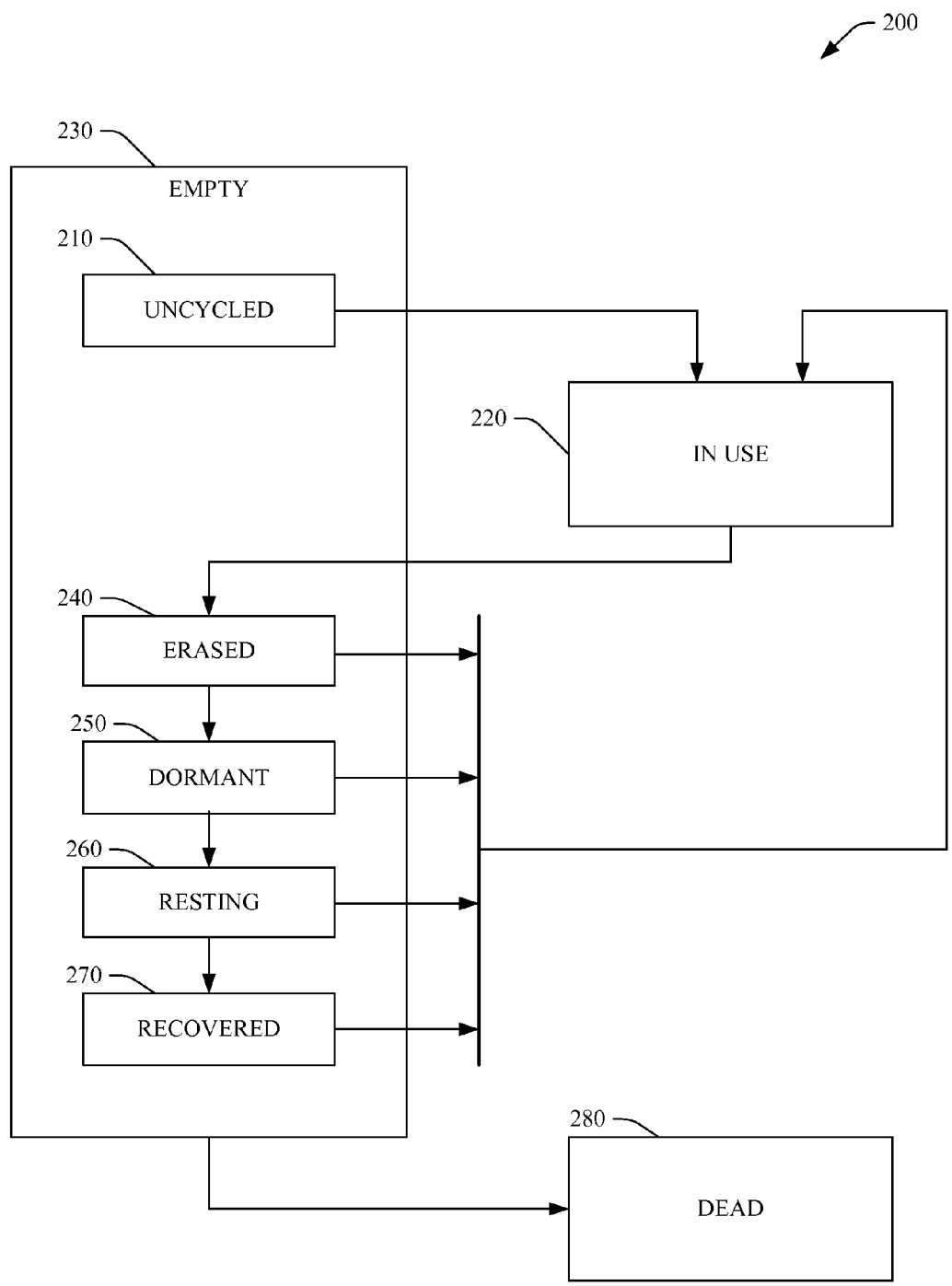
FIG. 2 illustrates a block diagram of certain states of a memory region in a memory in accordance with an aspect of the subject matter disclosed herein.

FIG. 2 depicts a block diagram 200 of certain states of a memory region in a memory device in accordance with the disclosed subject matter. For example, memory 130 can be a non-volatile memory device (e.g., flash memory) that includes a plurality of memory regions (e.g., blocks, sectors, banks). One state that a memory region can be in is an uncycled state 210 (e.g., virgin). A memory region can be in the uncycled state 210 when the memory region has never been used, such as can be found in a new memory device 130, for example, or where the memory device 130 has been used, in part, but has some uncycled memory regions 210 remaining, for example. When data is written to a memory region, the memory region can be in an "in use" state 220. As long as the memory region has data in it, whether valid or antiquated, the memory region can be in the "in use" state 220. Another state that a memory region can be in is an empty state 230. When a memory region is in the empty state 230, the memory region contains no valid data. There are a number of states associated with the empty state 230 in which a memory region can be. One example of an empty state 230 is when a memory region is in an erased state 240, where the memory region has been erased (e.g., flash memory where all it are set to ones) and has no valid data therein. The memory block 210 can be in an erased state 230 immediately after the block 210 has been erased, for example.

After a memory region has been subject to an erase cycle, but before the erase cycle has been completed, a memory region can be in a dormant state 250, which can be one type of resting state 260, discussed more fully below. For example, a memory region can be in the dormant state 250, or a half-erased state, during an erase operation of a flash memory, as the memory region can be pre-programmed to prepare the region for an erase. That is, the erase operation (e.g., cycle) can be partially completed, such as changing the values in the memory region to all 0's, in a flash memory, for example, and not completing the erase process to pulse the memory bits in the memory region to all 1's, the erased state for flash memory. When the memory region is in the dormant state 250, or when the erase of the region has just been completed, the memory region can be in a resting state 260. This is the period where the memory region is resting between erase cycles, so that the life span of the memory region can be optimized, the read margin can be maintained (or at least the loss of read margin can be minimized or reduced), and future programming errors can be minimized or reduced. During the resting state 260 (including the dormant state 250), the length of time in such a state can be monitored, as the longer the memory region rests, the better recovery the memory region can make so as to preserve its life span, etc., until the memory region reaches the point where any additional rest will not yield any additional benefits. Thus, it is desirable to allow a memory region to be in resting state 260, and not subject it to another erase cycle, until all potential benefits can be realized.

Once the memory region has rested for a sufficient period that any further rest time will not result in additional benefit with regard to optimizing the performance (e.g., life span) of the memory region, the memory region will be in the recovered state 270. It should be noted that the recovered state 270 can also include a memory region that is in an uncycled state 210, as an uncycled memory region will be sufficiently rested, since it has never been cycled. Thus, the uncycled state 210 also can be one type of empty state 230. Once a memory region is in the empty state 230, the memory region can be returned to the "in use" state 220 by writing data to the region, although it is to be appreciated that it is desirable, for the reasons stated herein, to allow a memory region sufficient time to rest and recover before using a memory region and subjecting the memory region to another erase cycle.

Another type of state a memory region can be in is a dead state 280. A memory region can be in the dead state 280 if, for example, a memory region is no longer functioning, or is no longer functioning properly (e.g., high amount of programming errors), or is otherwise no longer useable.

It should be noted that, generally, the longer the period of time between erase cycles for a memory region, the more benefit that can be achieved to maintain that memory region. The benefits can include maintaining read margin, or at least minimizing or reducing a loss of read margin; preventing, minimizing or reducing programming errors in the memory region; and/or maintaining (e.g., optimizing) the useful life of the memory region.

The length of time desired for memory region to rest and recover can be dependent on a time-temperature relationship that exists with regard to memory regions in non-volatile (e.g., flash) memory 130. As the temperature associated with a memory region increases, the length of time between erase cycles for that memory region to sufficiently rest so that the memory region can fully recover can be correspondingly reduced. The time-temperature dependency can be predetermined so that an amount of time desired to sufficiently rest and attain a recovered state for a memory region can be known. Once the memory region has rested to the point of recovery, further rest will provide little or no additional benefit with regard to reducing or preventing the loss of read margin and/or programming errors, and/or maintaining the useful life, of the memory region.

Further, even if a memory block has not reached the recovered state, it can still benefit from the rest it does receive during the resting state. That is, the longer the memory block rests between erase cycles (before reaching the recovered state), the more benefit (e.g., reducing or preventing loss of read margin and/or programming errors, and/or maintaining useful life) that can be achieved.

Figure 3:
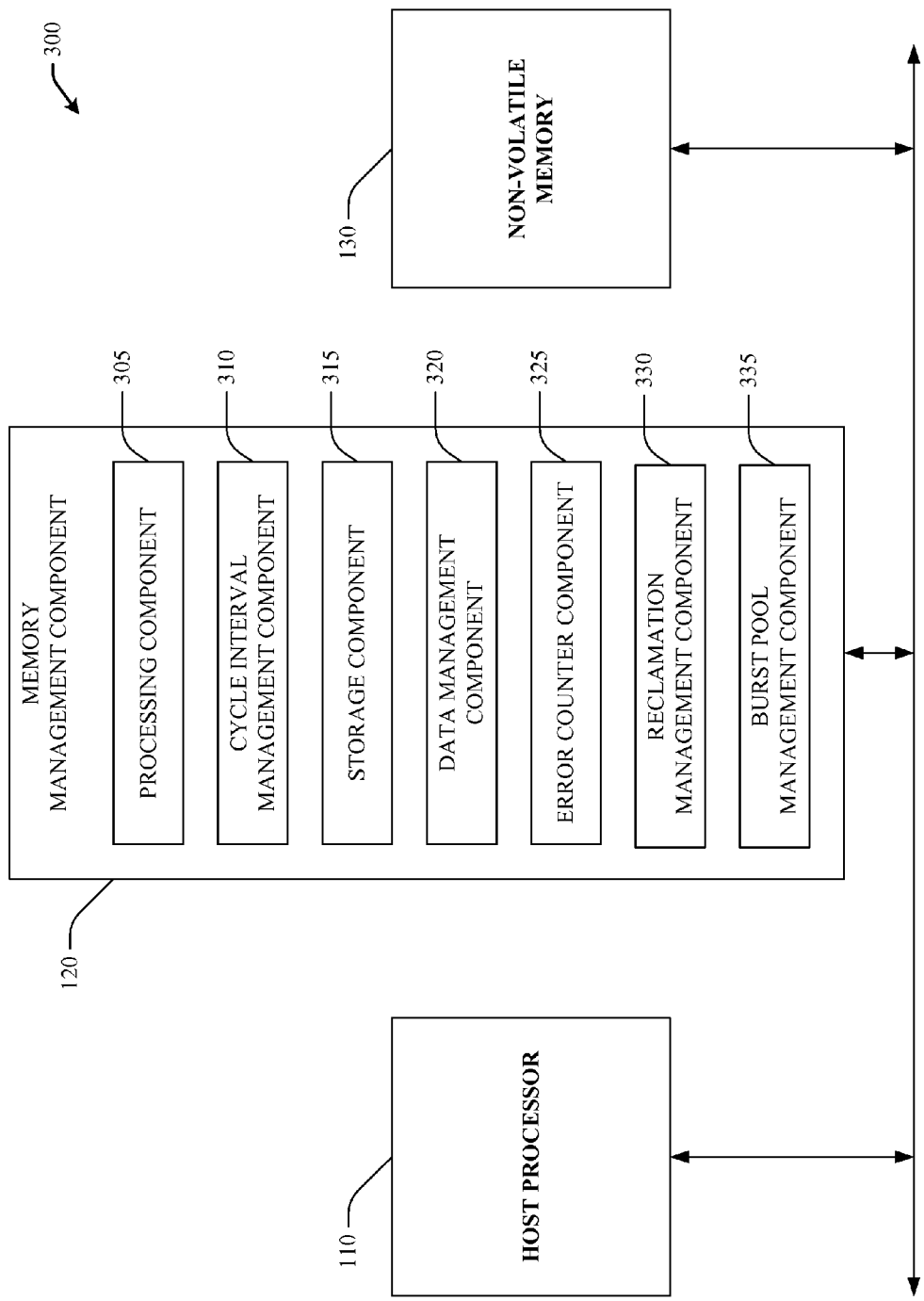
FIG. 3 illustrates a system for memory management in accordance with an aspect of the subject matter disclosed herein.

Referring now to FIG. 3, a system 300 for memory management is illustrated in accordance with the disclosed subject matter. System 300 can include a host processor 110 that can be associated with a memory management component 120 that can facilitate management of wear leveling of a memory device 130 associated therewith via a bus. The host processor 110 can be a typical applications processor that can manage communications and run applications. For example, the host processor 110 can be a processor utilized by a computer, a mobile handset, PDA, or other electronic device. The memory 130 can be non-volatile memory, such as flash memory or EEPROM, for example.

In accordance with one embodiment of the disclosed subject matter, the memory management component 120 and memory 130 can be situated on a single chip. In accordance with another embodiment, the memory management component 120 and memory 130 can be placed or formed on separate chips.

Memory management component 120 can minimize or reduce wear, loss of margin, and programming errors in memory regions in a non-volatile memory (e.g., flash memory) 130. Memory management component 120 can include a processing component 305 that can interact and/or interface with other components of system 300, whether such components are software and/or hardware and can facilitate management of the memory 130. Memory management component 120 can also include a cycle interval management component 310 that can facilitate managing erase cycles of memory regions in non-volatile memory such that a memory region can be given sufficient time between erase cycles to rest and recover before being subject to another erase cycle.

A time-temperature relationship can exist with regard to memory regions in non-volatile (e.g., flash) memory. As the temperature associated with a memory region in memory 130 increases, the length of time between erase cycles for that memory block to sufficiently rest to recover can be correspondingly reduced. Conversely, the lower the operating temperature of the memory 130, the longer the length of time between erase cycles for a memory region in memory 130 to sufficiently rest to reach the recovered state. The operating temperature of memory 130 can be predetermined and/or alternatively can be determined during use. The time-temperature dependency can be predetermined so that an amount of time desired to sufficiently rest and attain a recovered state for a memory region can be known for a given operating temperature.

Cycle interval management component 310 can keep time and can track the amount of time since the last erase cycle for a memory region. Component 310 can have information regarding the non-volatile memory as to a period of time the memory regions in the non-volatile memory desire to rest and recover. Cycle interval management component 310 can also facilitate recording the time a particular region was last subject to an erase cycle, where such information can be utilized to determine which regions are recovered and/or most rested, as compared to other regions. Such time information can be recorded in storage component 315, for example, which can be volatile memory, such as RAM. The time information can be stored and updated in storage component 315, and periodically, as desired, such time information can be stored and updated in memory 130 as well.

In accordance with one embodiment of the disclosed subject matter, the time of an erase cycle for a memory region can be recorded using a time stamp that can be associated with the corresponding memory region and stored in storage component 315 and/or memory 130. The time stamps of respective memory regions can be compared to determine which memory region(s) can be made available. For example, a time stamp associated with a memory region can be utilized to determine the amount of rest the memory region has had, and whether the memory region is recovered. Further, the time stamp of the memory region can be compared to the time stamp of another memory region to determine which memory region is more rested.

In accordance with another embodiment of the disclosed subject matter, information regarding an erase of a memory region can be included in a list that can be stored in storage component 315 and/or memory 130. For example, when a particular memory region is erased, information, such as information identifying the memory region and/or the time of the erase cycle, can be included on a list. The list can be maintained such that the memory regions can be listed in an order of the most recently erased (and thus, least rested) memory region being placed at the bottom of the list and the region having the longest time since an erase cycle (and thus, most rested) can be placed at the top of the list. In one aspect, a first-in-first-out (FIFO) queue can be utilized such that the memory regions can be made available based on the respective position on the list. The memory region at the top of the list can be the first memory region in the queue, the second region on the list can be the second region in the queue, etc., so that the memory region at the top of the list can be made available before the other memory regions that are below it on the list. As a memory region at the top of the list is made available, the list can be updated, and all the other memory regions in the queue can move up one position in the queue. It is to be appreciated that, a FIFO arrangement is but one arrangement that can be utilized, and the disclosed subject matter is not so limited. Any suitable ordering or queuing can be utilized, as desired, in accordance with the disclosed subject matter.

In accordance with yet another embodiment of the disclosed subject matter, information regarding an erase of a memory region can be included in a table, where the table can include information regarding all memory regions of memory 130. The table can be stored in storage component 315 and/or memory 130. For example, when a particular memory region is erased, information, such as information identifying the memory region and/or the time of the erase, can be included in a place in the table corresponding to that memory region. Such information can be used to determine which regions are most ready to be made available and most ready to be subject to another erase cycle, while still maintaining desired performance (e.g., minimize or reduce loss of margin and programming errors, improve useful life).

In accordance with still another embodiment of the disclosed subject matter, information regarding an erase of a memory region can be included in a tree representation, such as a binary tree, and such tree can be utilized in making determinations as to which memory regions should be selected to be made available to the available pool or used for a write operation. For example, the tree can be utilized to facilitate determining which memory regions are recovered and/or well rested as compared to other memory regions.

Cycle interval management component 310 can also facilitate comparing the time stamps, and/or information on a list or table, respectively associated with memory regions to a time value at the moment that memory regions are being sought, such as for a write operation or an erase cycle. Further, component 310 determine which memory regions have rested long enough to recover as well as which memory regions, while not recovered, are more rested than other regions that are resting. Cycle management component 310 can further facilitate monitoring the operating temperature of the memory (e.g., flash memory) to, for example, determine a period a time for a particular memory region to attain the recovered state. Information regarding the operating temperature can also be maintained with the time stamp information, list information, and/or table information associated with respective memory regions, and can be stored in storage component 315 and/or memory 130.

Memory management component 120 can include a data management component 320 that can facilitate the performance of various types of data placement and wear leveling as desired to facilitate minimizing the wear on memory regions in memory 130. In accordance with one aspect of the disclosed subject matter, data management component 320 can facilitate performing address translation when placing incoming data into memory 130. As pieces of data are being received into memory 130, a logical block address can be associated with each piece of data, and such logical block address can also be associated with a physical block in memory 130 where the piece of data is to be stored. The logical block address and its associated translation, which can be used to translate it to the physical block address, can be stored in a table (e.g., address translation table) stored in memory 130 and/or storage component 315. Address translation can be utilized in conjunction with other wear leveling techniques or mechanisms (e.g., "peanut butter" wear leveling), as disclosed herein, in order to facilitate placement of incoming data so as to minimize or reduce wear on memory blocks.

Data management component 320 can also facilitate performing pseudo-wear leveling where incoming associated pieces of data can be placed in more than memory region such that the pieces of data are not all placed in one memory region. For example, a first piece of data can be placed in memory region A, a second piece of data can be placed in region B, etc., until the data is all written to memory 130.

Further, static wear leveling can also be performed to move valid data from one memory block to another memory block, so that the original memory block can be erased and made available. Static wear leveling can be employed for a number of reasons. Static wear leveling can be employed, for example, to more evenly spread erase cycles across memory regions, as some memory regions may not be erased for long periods of time (e.g., song data in memory on an MP3 player), as compared to other memory regions that may be erased more frequently. Static wear leveling can thereby reduce the wear to memory regions to reduce problems associated with wear on memory regions (e.g., loss of margin, programming errors).

Data management component 320 can also employ dynamic wear leveling to facilitate placing incoming data into memory regions as well as facilitating management of "dirty space" in memory regions in memory 130. When data is being written to memory 130, dynamic wear leveling can be employed to place the incoming data to memory regions in memory 130 that have available space.

Various other types of wear leveling can also be performed via data management component 320. For example, "peanut butter" wear leveling, which is akin to "data striping" and pseudo-wear leveling, can be performed, where pieces of data associated with a write operation can be "striped" across memory regions when writing the data to memory 130. More particularly, "peanut butter" wear leveling can be performed such that, during a write operation, a first piece of data associated with a write operation can be written to a first memory region, a second piece of data associated with the write operation can be written to a second region, a third piece of data associated with the write operation can be written to a third region, etc., so that associated pieces of data can be spread over a number of regions, instead of possibly only one region, depending on the size of the data. As will be further disclosed below, "peanut butter" wear leveling can facilitate management of memory 130 (e.g., reduce loss of margin, reduce programming errors, etc.)

At certain times, such as when the occupancy rate of the memory regions in memory 130 is very high, "peanut butter" wear leveling may be less practical or less efficient. During such times, data management component 320 can facilitate choosing other types of wear leveling. For example, data management component 320 can facilitate performing "in order" wear leveling, where data can be placed (e.g., written) to memory regions in memory 130 such that, during a write operation, a first piece of data can be written to a portion of a memory region and subsequent pieces of data can be written to the same memory region in order until the region is filled, and then data can be written in order to another region(s) until the write operation is complete. "In order" wear leveling can be advantageous where there are few memory regions available due to a high occupancy rate with regard to memory regions in memory 130, for example.

Memory management component 120 can also include an error counter component 325 that can track and maintain a count of the number of programming errors with regard to each memory region in non-volatile memory 130. The error count for a memory region can be incremented each time a programming error associated with the memory region occurs and such information can be stored in a list or a table in the memory 130 and/or other memory (e.g., storage component 315), for example. In accordance with one aspect, the error count can be the number of programming errors associated with a particular memory region. In accordance with another aspect, the error count can be an average number of programming errors per erase cycle associated with a particular memory region.

Information regarding programming error counts of respective memory regions can be utilized when determining which memory regions to write to based, in part, on which memory region(s) has a lower number of programming errors, or a lower average number of errors per erase cycle. For example, memory region A may have an erase count of fifty, but has an error count of only three errors. Region B may have an erase count of twenty, but an error count of fifteen errors. While region B has fewer erase cycles than region A, region A has fewer programming errors than B. As a result, region A may be written to or reclaimed, as desired, before or instead of region B, because region A has a lower number of errors than region B, even though region A has a higher erase count than region B.

If desired, for reasons such as efficiency of system 300, the list or table associated with programming errors may include memory regions that have an error count that meet or exceed a predetermined threshold amount, and not include memory regions that have an error count that is below the predetermined threshold amount. However, the error count will still be maintained in storage component 315 and/or memory 130 and associated with the memory region, even if it is not listed in the list or table. For example, a memory region may be placed on the list or table associated with programming errors if ten or more programming errors are associated with the memory region, but will not be placed on the list or table if the region has nine or less programming errors. The assumption being that, if the memory region has an error count of less than ten, there may not be much difference between a region with an error count of seven and a region with an error count of eight, for example. The memory regions that have less than a threshold level (e.g., ten errors) and are not on the list or table can be deemed memory regions with "low error" counts. The memory regions that are on the list or table and meet or exceed the threshold level can be deemed memory regions with "high error" counts.

It is to be appreciated that the list or table may also utilize multiple thresholds, as desired, to segregate the memory regions into different pools of memory regions based on the number of programming errors associated with a respective region. For example, the list or table may have a sublist or subtable (or alternatively, there may another list or table) that can include memory regions with an error count of twenty or less, and memory regions at or below the threshold level can be deemed regions with a "low error" count. Another sublist or subtable (or alternatively, there may another list or table) can include regions with an error count of twenty-one to forty errors, and regions within these threshold levels can be deemed regions with a "medium error" count. Yet another sublist or subtable (or alternatively, there may another list or table) can include regions with an error count of more than forty, and regions at or above this threshold level can be deemed regions with a "high error" count.

Memory management component 120 can further include a reclamation management component 330 that can facilitate reclaiming memory regions so that such regions can be made available, where the regions can be placed in an available pool, for example. Reclamation management component 330 can facilitate identifying which memory region to reclaim, and can distinguish between valid data in a memory region and other data stored therein that has been antiquated or deleted (e.g., invalid data) for some reason. Reclamation management component 330 can facilitate retrieving the valid data and moving it to a new memory location (e.g., new memory region), and erasing the memory region thereby disposing of the data that is no longer valid to reclaim the "dirty" space (e.g., memory space having invalid data) for future use for storing other valid data. Memory region reclamation, also referred to herein as "garbage collection" (GC) can be implemented with various timing strategies, including "Just In Time" (JIT) (e.g., forward GC), where garbage collection is not performed until the memory space is needed; "Background" (BGD) (e.g., reverse GC), where memory regions can be proactively reclaimed; or "on demand" (OD), where the garbage collection can be controlled by an entity, such as a user, for example.

Memory management component 120 can further include a burst pool management component 335 that can facilitate maintaining a number or percentage of memory regions (e.g., burst pool) that can be reserved so that such regions can readily be made available for storage needs, as opposed to having to erase regions at essentially the same time a write operation is desired to be performed to make memory space available for the data being written because there were not enough regions available to complete the write operation. It is desirable that the memory regions reserved for the burst pool be memory regions that are recovered, although such is not a requirement. For example, if there are not enough recovered memory regions available to meet the minimum number or percentage specified for the burst pool, then regions that are still in the resting phase can be placed in the burst pool, preferably those regions will be well-rested regions as compared to all memory regions that are in the resting phase at that time. Having a burst pool of memory regions can reduce having to erase memory regions that have not recovered, as having to erase memory regions that have not recovered can result in such memory regions having reduced read margins, reduced useful life, and an increased number of programming errors.

In accordance with one embodiment of the disclosed subject matter, memory management component 120 can optionally include an erase counter component (not shown) that can track and maintain a count of the number of erase cycles with regard to each memory region in non-volatile memory 130. Each time a particular memory region is subject to an erase cycle, the erase counter component can increment the erase count for that particular memory region. Information regarding erase counts of respective regions can be utilized when determining which memory regions to write to based, in part, on which memory region has the fewest number of erase cycles. For example, if the failure rates of memory regions are non-linear and/or very low, data placement to memory regions may be based, in part, on which memory region has the fewest number of cycles.

The number of erase cycles of a particular memory region can be maintained in a list, table, or tree stored in storage component 315 and/or memory 130. If desired, for reasons such as efficiency, the list, table, or tree may only include memory regions that have an erase count that meet or exceed a predetermined threshold amount. For example, a memory region may be placed on the list, table, or tree associated with erase counts if ten or more erase cycles have been performed on the memory region, but will not be placed on the list, table, or tree if the region has an erase count of nine or less. The assumption being that, if the memory region has an erase count of less than ten, there may not be much difference in performance or wear between a region with an erase count of seven and a region with an erase count of eight, for example.

As an example of an implementation of system 300, data management component 320 can choose to employ address translation when placing incoming data into memory blocks in memory 130. The pieces of incoming data can each be associated with a logical block address, which can also be associated with a physical block address in memory 130 where the respective piece of data will actually be stored. Information regarding the translation from the physical block address to the logical block address can be stored in a translation table, for example. Data management component 320 can further use "peanut butter" wear leveling, in conjunction with address translation, to place (e.g., write) data into memory blocks in memory 130.

When a write operation is initiated, data management component 320 can facilitate writing incoming data to memory regions that are recovered with a low number of programming errors over other memory regions, where, for example, a low number of programming errors can be a number of errors under a threshold amount. If no recovered memory regions are available at the time of the write operation, the data management component 320 can facilitate choosing an erased region(s) that is not yet recovered, but has a low number of errors (e.g., below threshold) as compared to other non-recovered memory regions. For example, an erased region can be a region that is resting or dormant, with a low error count. If no erased region with a low error count exists, then data management component 320 can facilitate choosing recovered region that have a higher number of errors, where, for example, a memory region can be considered to have a higher number of errors, where the number of errors is over a threshold amount, for example. If there are no empty memory regions available (e.g., no recovered or erased regions), then reclamation management component 330 can initiate a garbage collection to identify and collect memory regions that have some invalid data stored therein (e.g., "dirty" memory regions). The garbage collection can be JIT garbage collection, for example.

With further regard to the type of wear leveling chosen, if the occupancy rate of the memory 130 exceeds a predetermined threshold level (e.g., 80% or 90%), excluding the recovered memory regions reserved in the burst pool, then data management component 320 can facilitate switching from "peanut butter" wear leveling to "in order" wear leveling. "In order" wear leveling can result in fewer memory regions being used to perform a particular write operation, as compared to "peanut butter" wear leveling.

With further regard to garbage collection, if the occupancy rate of the memory 130 exceeds a predetermined threshold level (e.g., 70% occupancy rate or 90% occupancy rate), excluding the recovered memory regions reserved in the burst pool, then garbage collection can be performed on the "most dirty" regions until a predetermined minimum number or percentage of memory regions have been reclaimed and made available (e.g., in the available pool). A "most dirty" region (e.g., also referred to as "least occupied" memory region) can be, for example, a memory region that has an amount of valid data stored therein that is less than other regions, such that the memory region is positioned at a certain level or percentage of the total number of memory regions, based on the amount of valid data, so as to be below a predetermined threshold level, where regions that fall below the predetermined threshold level can be a "most dirty" region and regions that are above such threshold level can be a "more occupied" or "most occupied" memory region.

In accordance with one aspect of the disclosed subject matter, system 300 (as well as system 100), or portions thereof, can be included in most any electronic device, such as a computer, a PDA, a cellular phone, a digital phone, an answering machine, a video device (e.g., television, or digital versatile disk (DVD) player/recorder), a music player/recorder (e.g., compact disc (CD) player, MP3 player, etc.), a digital recorder, a digital camera, a microwave oven, an electronic organizer, an electronic toy, an electronic game, a scanner/reader, and the like, as well as other peripheral devices (e.g., printer) or other electronic devices (e.g., a copy machine, a facsimile machine) that include a memory component.

Figure 4:
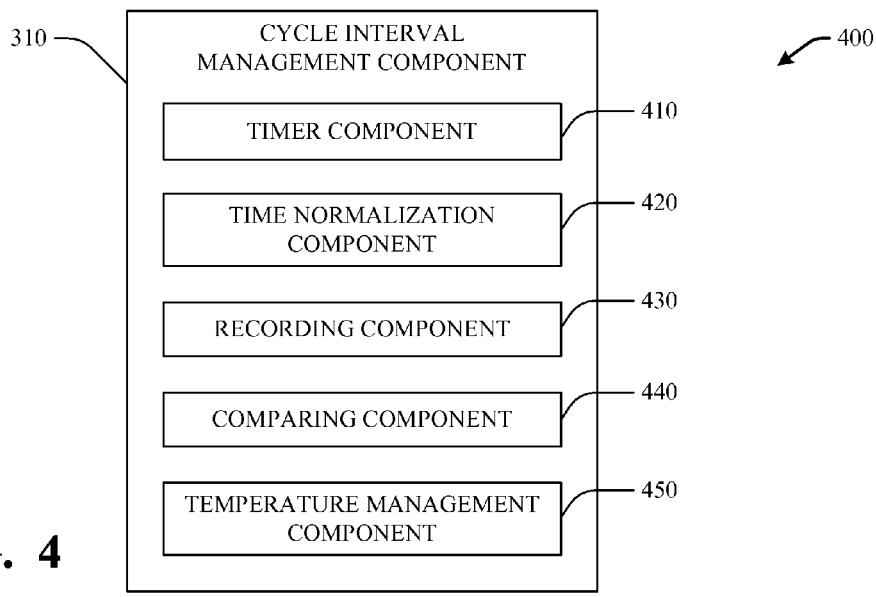
FIG. 4 illustrates a block diagram of a cycle interval management component in accordance with an aspect of the subject matter disclosed herein.

Referring now to FIG. 4, illustrated is a block diagram 400 showing cycle interval management component 310 in more detail in accordance with the disclosed subject matter. Cycle interval management component 310 can facilitate managing erase cycles of memory regions in non-volatile memory 130 (e.g., flash memory) such that a memory region is given sufficient time (or at least as much time as possible) between erase cycles to rest until the region has recovered before being subject to another erase cycle. Cycle interval management component 310 can include a timer component 410 that can be utilized to track the amount of time since a memory region was last subject to an erase cycle. In accordance with one embodiment of the disclosed subject matter, the timer component 410 can track the time during the period the component 310 is powered up. Further, timer component 410 can be a monotonically incremental timer. For example, timer component 410 can start at 0 and can incrementally increase while, and every time, the memory 130 is powered on. When the memory 130 is powered off and then on again, the timer count is not started over again at 0, but rather increments from the point it left off when the memory 130 was turned off.

Cycle interval management component 310 can also include a normalization component 420 that can be used to adjust or normalize the time associated with the resting phase (e.g., after an erase cycle) for a memory region to account for periods of time when component 310 is not powered up, but the memory region are still gaining additional rest. In accordance with an aspect of the disclosed subject matter, the normalization component 420 can include a multiplying function that, for example, can be predetermined based on the type of device, can be specified by a user based on expected amount of power-up time, and/or can be learned (e.g., by system 300) based on observed usage. For example, a normalization component 420 that is included in a computer may have one predetermined multiplying function associated with it to account for an expectation that the computer will be on for extended periods of time; in contrast, a normalization component 420 in a camera may have a different predetermined multiplying function based on an expectation that the camera will be on only periodically. Further, the normalization component 420 can adjust the multiplier factor or normalization factor where observed used of a device is different from an expected usage amount. Predetermined and known to cycle interval management component 310 can be information regarding the non-volatile memory 130 as to a period of time the memory regions in the non-volatile memory 130 desire to recover.

Cycle interval management component 310 can also include a recording component 430 that can monitor and record the time a particular memory region was last subject to an erase cycle, so that a determination can be made as to which regions are recovered and/or most rested, as compared to other regions. In accordance with one embodiment of the disclosed subject matter, recording component 430 can generate a time stamp of the time that a region was subject to an erase cycle, and the time stamp can be stored in storage component 315 and/or memory 130 to be used to determine which memory region has recovered, or if there are memory regions that are not recovered, the time stamp can be used to determine which memory region(s) has received the most rest, as compared to the other memory regions. In accordance with another embodiment of the disclosed subject matter, the time of an erase cycle of a region can be included in a list, table, or tree representation that can be stored in storage component 315 and/or memory 130, and can be referenced when determining whether the amount of rest a memory region has received and whether the region has recovered.

Such information can be used to facilitate the making of a determination as to which memory regions are most ready to be used again and most ready to be subject to another erase cycle, while still maintaining a desired level of performance (e.g., minimize or reduce loss of margin and programming errors, enhance useful life).

Further, cycle interval management component 310 can include a comparing component 440 that can compare time stamps respectively associated with memory regions to a time value at the moment that an operation (e.g., write, erase, reclaim) is being initiated. Where a list, table, or tree is employed to contain information associated with erase cycles and resting time of memory regions, comparing component 310 can facilitate comparing such erase cycle and rest information associated with the memory regions. Further, comparing component 440 can facilitate a determination as to which memory region(s) has rested long enough to recover as well as which memory region(s), while not recovered, is more rested than other regions that are resting.

A temperature management component 450 can also be included and can facilitate monitoring the operating temperature of the memory 130, such as flash memory. The length of time for a memory region to recover can correspond with the operating temperature of the memory 130. For example, the higher the operating temperature of memory 130, the shorter the period of time until the memory region recovers. In accordance with one aspect of the disclosed subject matter, information regarding the operating temperature of memory 130 can be utilized to determine the desired length of time for a memory region to rest to recover.

Figure 5:
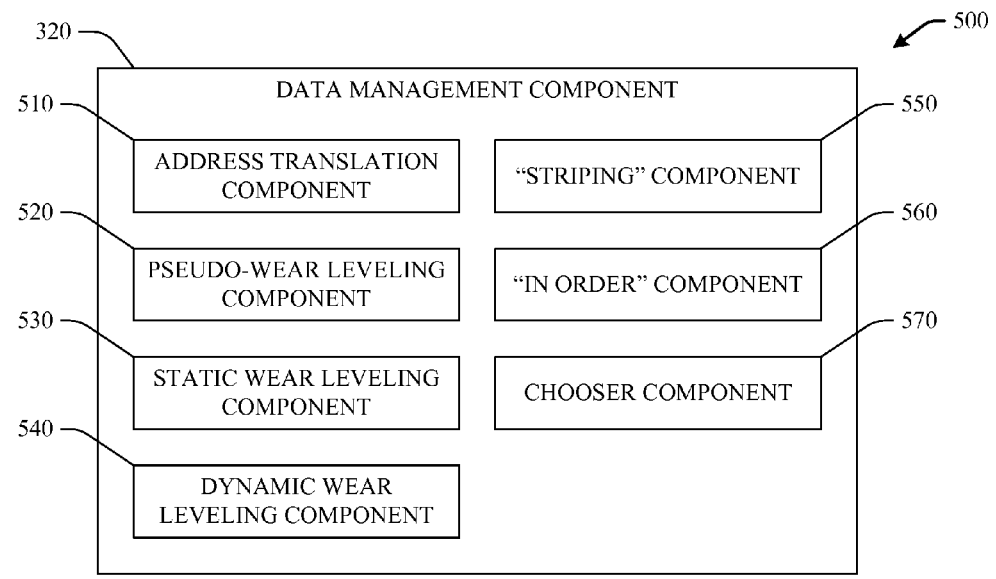
FIG. 5 illustrates a block diagram of a data management component in accordance with an aspect of the subject matter disclosed herein.

Turning now to FIG. 5, a block diagram 500 that illustrates data management component 320 in more detail in accordance with the disclosed subject matter. Data management component 320 can facilitate the performance of various types of data placement and wear leveling as desired to facilitate minimizing the wear on memory regions in non-volatile memory (e.g., memory 130).

In accordance with one aspect of the disclosed subject matter, data management component 320 can include an address translation component 510 that can facilitate performing address translation when placing incoming data into memory 130. As pieces of data are being received into memory 130, a logical block address can be associated with each piece of data, and such logical block address can also be associated with a physical block in memory where the piece of data is to be stored. The logical block address and its associated translation, which can be used to translate it to the physical block address, can be stored in a table (e.g., address translation table) stored in storage component 315 and/or memory 130, for example. Address translation can be utilized in conjunction with other wear leveling techniques or mechanisms, as disclosed herein, in order to facilitate placement of incoming data so as to minimize or reduce wear on memory regions. For example, address translation can be implemented as one layer of wear leveling, and then another type of wear leveling, such as "peanut butter" wear leveling can also be used as a second layer of wear leveling in order to minimize or reduce wear on memory regions.

Use of address translation may be desirable and advantageous when placing incoming data in non-volatile memory (e.g., flash), as a data value stored in flash memory cannot be changed as readily as a data value in RAM or static RAM (SRAM), for example. With flash memory, to change a data value, valid data in a particular memory region (e.g., block, sector) would have to be moved to another region, the particular region would have to be erased, and the new data value and the other valid data would have to be stored in the other memory region. By using address translation, instead of trying to change the data value in the memory region where it is stored, the logical block address can be redirected to a different physical memory address in the memory 130, where the data value has also been stored.

Further, address translation may be desirable with regard to bad memory region management. For example, if a memory device has a particular memory region that is bad no longer useable, and incoming data would be routed to a physical block address in the bad region, address translation can be employed to change the physical memory address that the logical block address is associated with and instead link the logical block address to a different physical memory address in the same memory device or different memory device, and the incoming data can be stored in that different physical memory address.

Data management component 320 can include a pseudo-wear leveling component 520 that can facilitate performing pseudo-wear leveling to reduce wear on memory blocks by placing data in memory blocks, so that incoming associated pieces of data can be placed in more than memory region such that the pieces of data are not all placed in one memory region. For example, if there are ten memory regions in a memory 130, a first piece of data can be placed in memory region A, a second piece of data associated with the first data piece can be placed in region B, etc., across all ten regions and then wrapped around to start with the first region again, if necessary, until the data is all written to memory 130.

Further, component 320 can include a static wear leveling component 530 that can facilitate moving valid data from one memory region to another memory region, so that the original memory region can be erased and made available. Static wear leveling can be employed for a number of reasons. For example, if a music player (e.g., MP3 player) has songs stored in certain memory regions in a flash memory, data associated with the songs may remain in those regions for a long period of time. In the meantime, other memory regions may be subject to numerous erase cycles, which may result in these other memory regions being subject to wear and cause problems associated therewith (e.g., loss of margin, programming errors). It therefore may be desirable to move the song data from the memory regions in which the song data reside to other available regions, so that the regions that contained the song data can be erased and made available in order to more evenly spread erase cycles across the memory regions.

Data management component 320 can also include a dynamic wear leveling component 540 that can facilitate placing incoming data into memory regions as well as facilitating management of "dirty space" in memory regions in memory 130. In contrast to static wear leveling, dynamic wear leveling can involve the placement of incoming data to memory regions such that the incoming valid data that is being written to memory 130 may be placed in a memory region has available space.

Data management component 320 can also include a "striping" component 550 that can facilitate performing wear leveling such as "peanut butter" data placement (e.g., wear leveling), where pieces of data associated with a write operation can be "striped" across multiple memory regions when writing the data to memory 130. More particularly, "peanut butter" wear leveling can be performed such that, during a write operation, a first piece of data associated with a write operation can be written to a first memory region, a second piece of data associated with the write operation can be written to a second region, a third piece of data associated with the write operation can be written to a third region, etc., so that associated pieces of data can be spread over a number of memory regions, instead of possibly only one region, depending on the size of the data. By writing pieces of data to memory 130 in such a manner, the likelihood of erasing a particular memory region(s) associated with the write operation may be reduced, even when the data is no longer valid. If all pieces of data were written to only one memory region and then that data became antiquated or invalid, the memory region might become subject to an erase cycle, possibly before the region has had adequate time to rest and recover. By spreading the pieces of data across a number of memory regions, if the associated pieces of data become antiquated or otherwise invalid, there may still be valid data from other write operations in those memory regions, and these regions may not be subject to an erase cycle until a later time, based on memory region reclaiming criteria, for example, preferably after the regions have had time to recover, where a garbage collection, for example, can be performed with regard to these regions to move valid data to other regions and making the original regions available.

Data management component 320 can also include an "in order" component 560 that can facilitate performing "in order" wear leveling, where data can be placed (e.g., written) to memory 130 (e.g., flash memory) such that, during a write operation, a first piece of data can be written to a portion of a memory region and subsequent pieces of data can be written to other portions of the same memory region in order until the memory region is filled. After the first memory region is filled, pieces of data then can be written in order to another region(s) until the write operation is complete. "In order" wear leveling can be advantageous where there are few memory blocks available due to a high occupancy rate with regard to memory regions in memory 130, for example, where "peanut butter" wear leveling may be less practical or efficient.

Component 320 can further include a chooser component 570 that can facilitate determining which type of data placement or wear leveling is to be performed. For example, chooser component 570 may initiate "striping" component 550 to perform "peanut butter" data placement to spread associated pieces of data through multiple memory regions so that a particular memory region does not have all the pieces of data stored therein, where the block may be erased if the data becomes invalid (e.g., deleted). At a later time, if the memory 130 reaches a predetermined threshold level associated with the occupancy, the chooser component 570 may initiate a switch to "in order" data placement via "in order" component 560 to account for the limited available memory regions. Further, on top of the "peanut butter" wear leveling being employed, chooser component 570 may also employ another layer of wear leveling, such as address translation via address translation component 510, which can be used in conjunction with the "peanut butter" wear leveling when placing incoming data in memory regions in memory 130.

Further, chooser component 570 can also determine which memory regions to write to during a write operation. For example, chooser component 570 can choose a recovered memory region(s) that has a low error count, over other available memory regions, in which to write the data. If no recovered memory region is available (e.g., in an available pool of memory regions), chooser component 570 can select an erased memory region(s) with a low error count, over other available regions, in which to write the data. If no such erased region is available, chooser component 570 can select a recovered region(s) with a high error count in which to write the data.

Various lists, tables, and/or trees (e.g., binary trees) can be employed to facilitate selection of memory regions for write, erase, or reclaim operations. For example, a list of recovered memory regions can be generated and maintained in storage component 315 and/or memory 130. A list of "well rested" memory blocks can be generated and maintained in storage component 315 and/or memory 130 as well. Further, a list of "low error" memory regions can be generated and maintained in storage component 315 and/or memory 130. In addition, a list of "least occupied" memory regions can be generated and maintained storage component 315 and/or memory 130. Such lists, tables, or trees can be updated at various times, such as when turning off a memory device, turning on the device, performing an operation, and/or periodically, for example.

Figure 6:
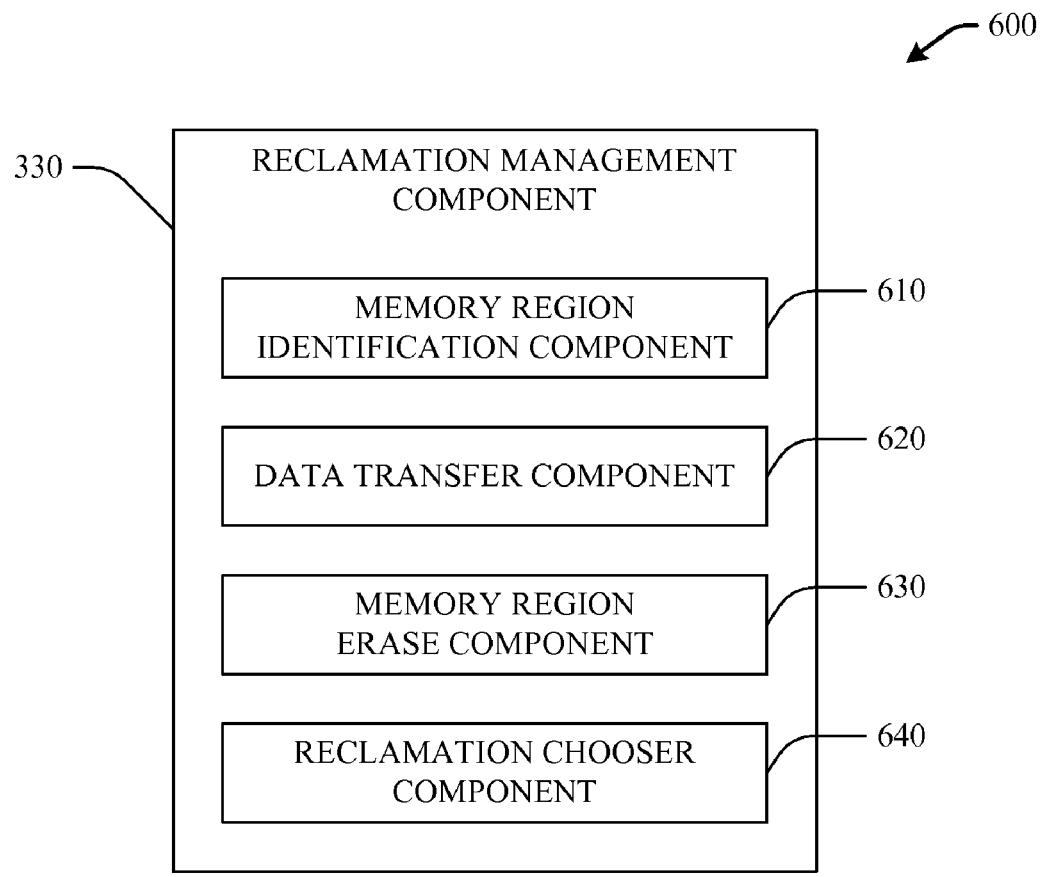
FIG. 6 illustrates a block diagram of a reclamation management component in accordance with an aspect of the subject matter disclosed herein.

FIG. 6 is a block diagram 600 that depicts reclamation management component 330 in further detail in accordance with the disclosed subject matter. Reclamation management component 330 can facilitate reclaiming memory regions so that such regions can be made available (e.g., placed in the available pool of memory regions). Block reclamation, also referred to herein as "garbage collection," can be implemented with various strategies, including JIT, where garbage collection is not performed until the memory space is needed; BGD, where memory blocks can be proactively reclaimed; and/or OD, where the garbage collection can be controlled (e.g., turned on/off) by an entity, such as a user, for example.

Reclamation management component 330 can include a memory region identification component 610 that can facilitate identifying which memory region to reclaim, and can distinguish between valid data in a memory region and other data stored therein that has been antiquated for some reason. Reclamation management component 330 can also include a data transfer component 620 that can facilitate retrieving the valid data from a memory region that is being reclaimed, and moving the valid data to a new memory location (e.g., memory region). Memory region erase component 630 can facilitate erasing the memory region being reclaimed thereby disposing of the data that is no longer valid in order to reclaim the "dirty" space (e.g., memory space having invalid data) for future use in storing other valid data.

Reclamation management component 330 can further include a reclamation chooser component 640 that can facilitate choosing which type of memory region reclamation (e.g., JIT, BGD, on demand) to use. Reclamation chooser component 640 can function such that no garbage collection is performed if there is a sufficient number of recovered memory regions available, that is, if there is a number or percentage of memory regions that meets or exceeds a predetermined minimum threshold level. For example, if the threshold level is set at 25%, and the memory space is initially filled up to 60% of capacity, and subsequently half of that data is deleted, there is still 40% of the memory regions that are empty, and recovered since the regions have not been erased (e.g., uncycled). Thus, no garbage collection will be initiated to reclaim the regions having invalid data (e.g., deleted data) because there is still sufficient empty (and recovered) memory space available. As a result, the performance can be optimized, because less power and resources are being utilized.

If the amount of memory space falls below the predetermined threshold level of empty memory space with regard to garbage collection, then reclamation chooser component 640 can initiate JIT garbage collection, unless there exist dormant or resting memory regions (e.g., regions that have not recovered yet), in which case, JIT garbage collection may not be initiated. This can optimize overall performance of the memory 130 and permit the resting and dormant regions to further rest so that such regions may reach the recovered state. Once the memory regions reach the recovered state, reclamation chooser component 640 may initiate the JIT garbage collection. Further, reclamation chooser component 640 can initiate JIT garbage collection when there is an occupancy rate that meets or exceeds a predetermined threshold level, where the occupancy rate can be determined without regard to the portion of memory 130 reserved for the burst pool.

There are times when JIT garbage collection may be desired, even when recovered memory regions are not available, such as when there is a high occupancy rate. In such instances, memory region identification component 610 can identify "dirty" memory regions and can further identify how much rest such regions have received since last subject to an erase cycle. Such regions can be reclaimed during the JIT garbage collection by reclaiming the most rested memory regions (e.g., well-rested memory regions) first, where the most rested regions can be a specified number or percentage of regions that have been resting the longest, for example; then, of the regions that did not qualify as most rested, reclaiming the regions with a low amount of programming errors, where a low amount can be determined based on a threshold number of errors; then, reclaiming the least occupied (e.g., "most dirty") memory regions, where a memory region can qualify as one of the least occupied regions if the memory region falls in an amount or percentage of region that is below a predetermined threshold level, based on the amount of valid data stored in the memory region.

One reason to reclaim the region that are "most dirty" over regions that have more valid data is the amount of time to reclaim a "most dirty" region is generally less than the amount of time to reclaim a "less dirty" region. This is because a region that is "more dirty" has less valid data that has to be moved to another region. The less valid data that has to be moved, the less time it takes to move the valid data. Another reason to reclaim the "most dirty" regions is the amount of memory space that is made free by reclaiming a "most dirty" region is greater than the amount of memory space made free by reclaiming a "less dirty" region. The "most dirty" region has less valid data being moved to another region than a "less dirty" region, and thus, more memory space is made available by reclaiming the "most dirty" region.

When there are not enough recovered regions available to reclaim, in determining which of the non-recovered regions to reclaim first, a first consideration can be to attempt to preserve read margin in the regions being reclaimed. Once that is no longer an issue, if more regions are still desired, then a second consideration can be attempting to keep a "bad" region (e.g., small read margin, memory region with high number of programming errors) from getting worse. A third consideration can be overall performance of the memory 130 and/or the system (e.g., 300, 100). When there are a sufficient number of recovered regions, performance of the memory 130 and/or the system (e.g., 300, 100) can be optimized.

Reclamation chooser component 640 can also initiate BGD garbage collection to reclaim recovered regions to reach a predetermined threshold amount of regions in the burst pool, which can be filled first, for example, and then recovered regions can be reclaimed to reach a predetermined threshold number of regions to be placed in the available pool. If desired, BGD garbage collection can also be performed to reclaim memory regions that are "most occupied" in that they contain an amount of valid data that is over a predetermined threshold amount, prior to reclaiming regions that are "least occupied" (e.g., "most dirty"). BGD garbage collection also can be initiated during powered idle time of the memory device 130, such as when a computer is on but not being used, for example.

Reclamation chooser component 640 can further facilitate OD garbage collection, where OD garbage collection can be initiated by an entity, such as a user, for example. In accordance with one aspect of the disclosed subject matter, OD garbage collection can be turning BGD garbage collection on or off.

FIGS. 7-12 illustrate methodologies in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Figure 7:
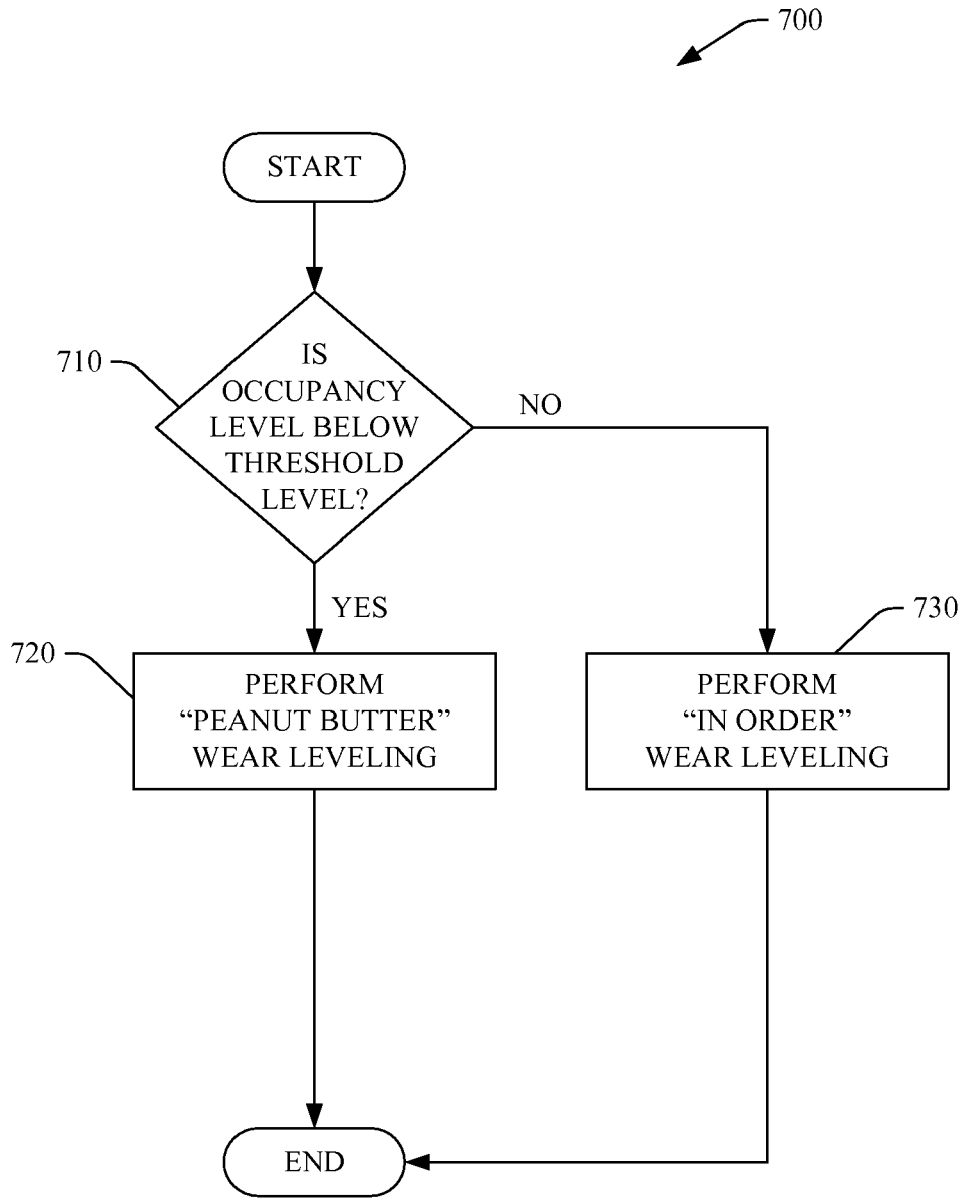
FIG. 7 illustrates a methodology that facilitates managing wear leveling of memory regions of a memory in accordance with an aspect of the subject matter disclosed herein.

Referring now to FIG. 7, a methodology 700 for programming data in memory in accordance with the disclosed subject matter is illustrated. At reference numeral 710, a determination can be made as to whether the occupancy level of memory is below a predetermined threshold level. If it is determined that the occupancy level is below the predetermined threshold level, then at reference numeral 720, "peanut butter" wear leveling (e.g., data placement) can be performed to write data into memory regions in memory. For example, when using "peanut butter" wear leveling, pieces of data associated with the write operation can be spread across a number of memory regions, such that a first piece of data can be written in a first region, a second piece of data can be written in a second region, and so forth, until the write operation is complete. At this point, the methodology 700 ends. If, at reference numeral 710, it is determined that the occupancy level is at or over the threshold level, then at reference numeral 730, "in order" wear leveling (e.g., data placement) can be performed. When "in order" wear leveling is performed, pieces of data associated with a write operation can be written in order into a region until the region is filled or substantially filled, and, if there are more pieces of data to be written, then those pieces are written to a second region until that region is filled or substantially filled, and so forth, until the write operation is complete. At this point, the methodology 700 ends.

Figure 8:
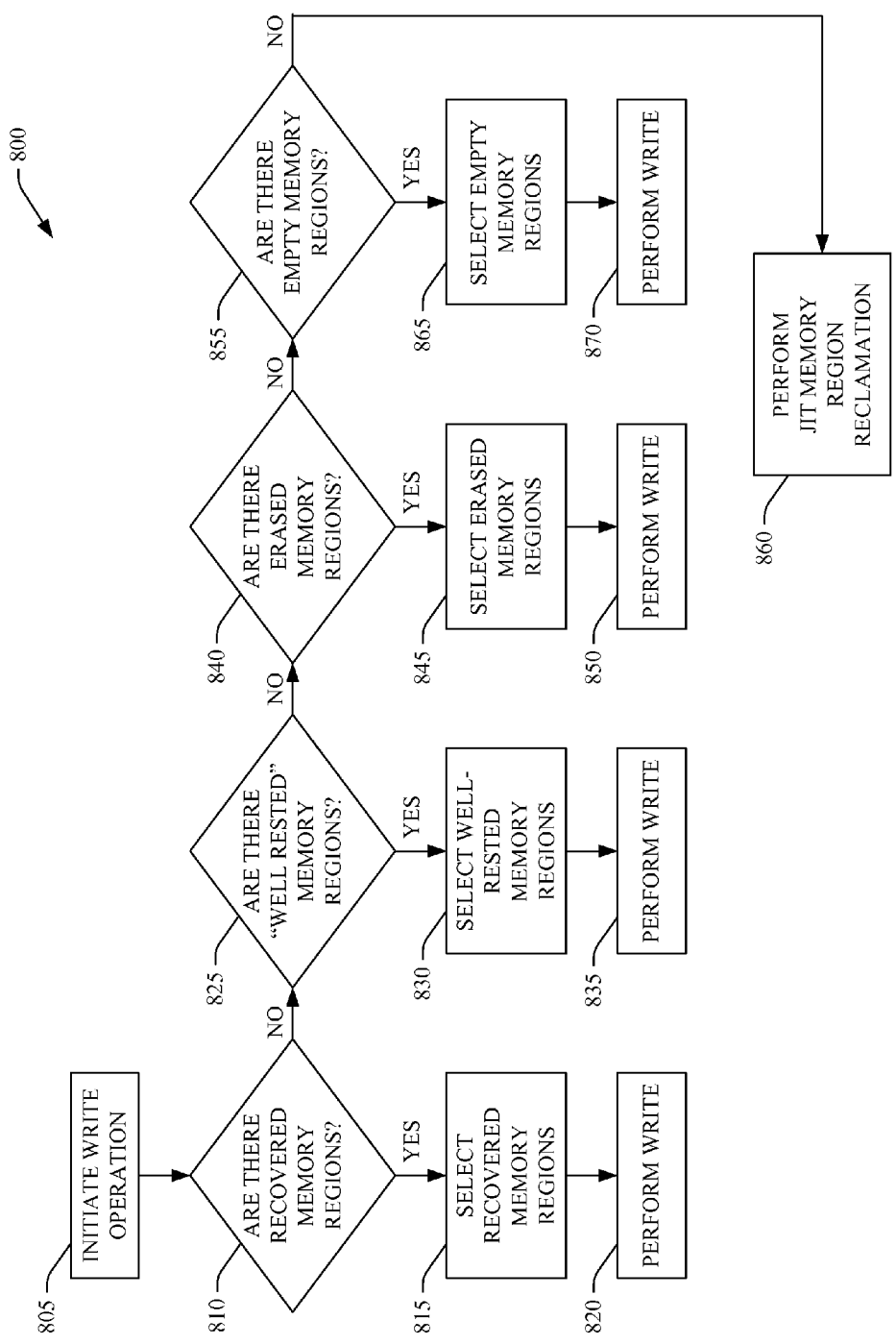
FIG. 8 illustrates a methodology that facilitates data placement in memory regions in a memory in accordance with an aspect of the subject matter disclosed herein.

Referring now to FIG. 8, a methodology 800 for managing placement of incoming data in accordance with the disclosed subject matter is illustrated. At reference numeral 805, a write operation associated with incoming data can be initiated. At reference numeral 810, a determination can be made as to whether there are recovered memory regions that have a low error count available. Recovered memory regions can be memory regions that are uncycled or have had enough time to rest since last being subject to an erase cycle so that performing the erase on the region will likely not cause a loss of margin, programming errors, and/or a reduction in useful life, for example. A memory region can have a low error count if the number of programming errors associated with the region is below a threshold level of programming errors, for example. Information regarding the number of programming errors associated with the region can be stored in memory 130 and/or storage component 315, for example. If at reference numeral 810, a determination is made that there are recovered regions with low error count available, then at reference numeral 815, the "low error" recovered memory regions can be selected. At reference numeral 820, the write operation can be performed and the incoming data can be placed (e.g., written) to such recovered regions. At this point the methodology 800 can end.

If, however, a determination is made at reference numeral 810 that recovered regions with low error count are not available, then at reference numeral 825, a determination can be made as to whether there are "well rested" memory regions with a low error count that are available. Such memory regions can be erased memory regions, and a memory region can be considered "well rested," for example, if such region has not rested long enough to be recovered, but it has rested for a period of time that meets or exceeds a predetermined threshold level of rest or it has received more rest than a certain number or percentage of other memory regions that are also in the resting state. If such "low error," "well rested" memory regions are available, then at reference numeral 830, such memory regions can be selected. At reference numeral 835, the write operation can be performed and the incoming data can be placed (e.g., written) to such memory regions. At this point methodology 800 can end.

If, however, a determination is made at reference numeral 825 that "well rested" memory regions with a low error count are not available, then at reference numeral 840, a determination can be made as to whether there are erased regions with low error count, but not "well rested," that are available. Erased regions can include memory regions that have been subject to an erase operation, but have not recovered yet, such as memory regions that are dormant and/or resting, for example. If there are erased memory regions that are not well rested, but with low error count, available, then at reference numeral 845, such erased memory regions can be selected. At reference numeral 850, the write operation can be performed and the incoming data can be placed (e.g., written) to such erased memory regions. At this point methodology 800 can end.

However, if a determination is made at reference numeral 840 that there are no erased memory regions with low error count available, then at reference numeral 855, a determination can be made as to whether there are empty memory regions with a high error count available. Empty memory regions can be memory regions that have been erased, and may just have been erased or have had some period of time to rest, or have reached the point of recovery. An empty memory region can have a high error count if the number of programming errors associated with the memory region is at or above a predetermined threshold number or level of programming errors. Information associated with the number of programming errors can be stored in memory 130 and/or storage component 315, for example, so that it may be read or retrieved as desired. If there are no empty memory regions with a high error count available, then at reference numeral 860, a JIT garbage collection can be performed to reclaim memory regions that have "dirty space" (e.g., invalid data stored in the region) which can be reclaimed. The garbage collection can result in any valid data in the memory region to be reclaimed being moved to another region, and such memory region can be erased and can begin to rest and recover, and be made available to receive incoming data to complete the pending operation. After the JIT garbage collection is performed at reference numeral 860, the methodology 800 can return to reference numeral 810 and proceeds until the write operation is performed. If, however, at reference numeral 855, a determination is made that there are empty memory regions with a high number of errors available, then at reference numeral 865, such empty memory regions can be selected. At 870, the write operation can be performed and the incoming data can be placed (e.g., written) to such empty memory regions. At this point methodology 800 can end.

With regard to methodology 800, it is to be understood that, for example, at reference numeral 810 (and similarly at reference numerals 825, 840, and/or 855), it may be determined that there are recovered memory regions with a low error count, but not in a sufficient amount for the write operation. In such case, the recovered memory regions can be utilized, and then available "well rested" memory regions with low error count can be utilized for the balance of memory regions desired to complete the write operation. Thus, even if not in sufficient number for a write operation, methodology 800 can utilize any more desired memory regions (e.g., recovered memory region) that are available with the balance of memory regions desired to complete a write operation selected from other types of memory regions, in accordance with methodology 800.

Figure 9:
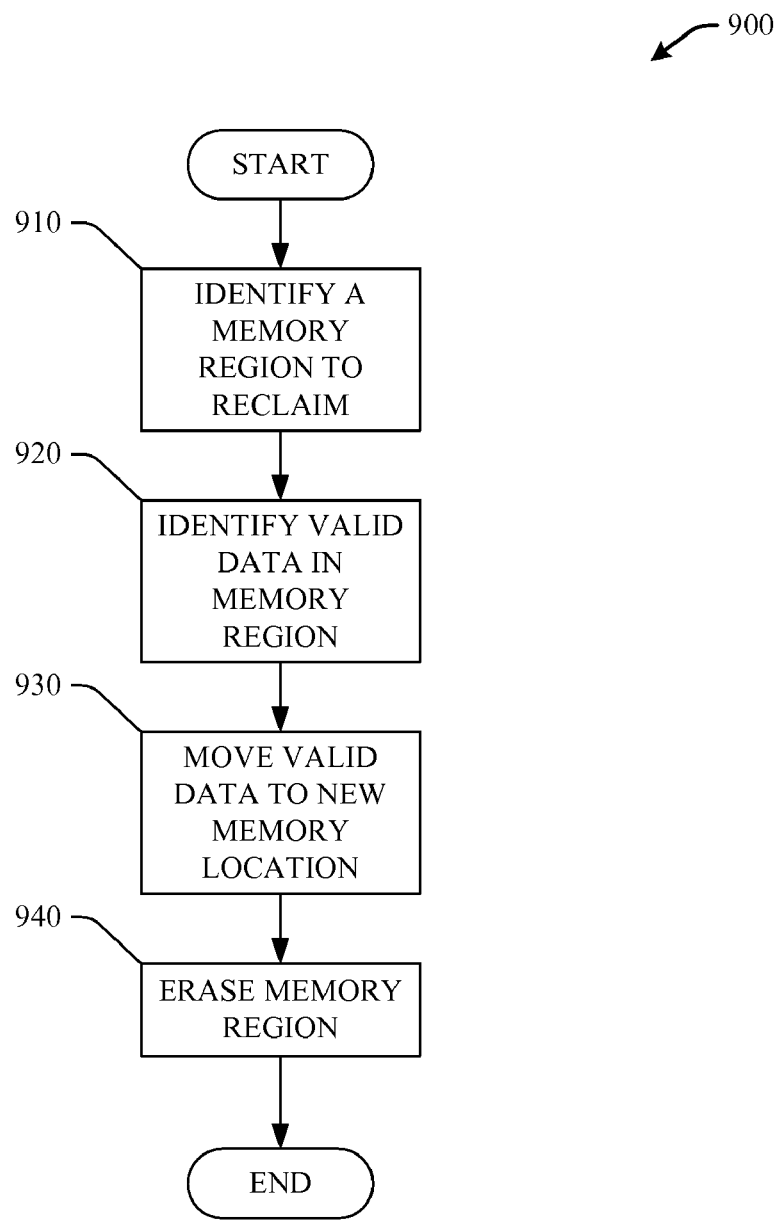
FIG. 9 illustrates a methodology that facilitates reclaiming memory regions in a memory in accordance with an aspect of the subject matter disclosed herein.

Referring now to FIG. 9, a methodology 900 for reclaiming memory regions in accordance with the disclosed subject matter is illustrated. At reference numeral 910, a memory region that can be reclaimed can be identified. For example, a memory region may be reclaimed when it has "dirty space" therein, where "dirty space" can be invalid (e.g., antiquated, deleted) data stored therein that can be disposed of by an erase cycle in order to make the memory space in the memory region available. At reference numeral 920, valid data in the memory region can be identified and distinguished from invalid data. At reference numeral 930, the valid data can be moved (e.g., written) to a new memory location in another memory region. At reference numeral 940, the memory region to be reclaimed can be subject to an erase cycle and erased, thereby being reclaimed. At this point, methodology 900 ends.

Figure 10:
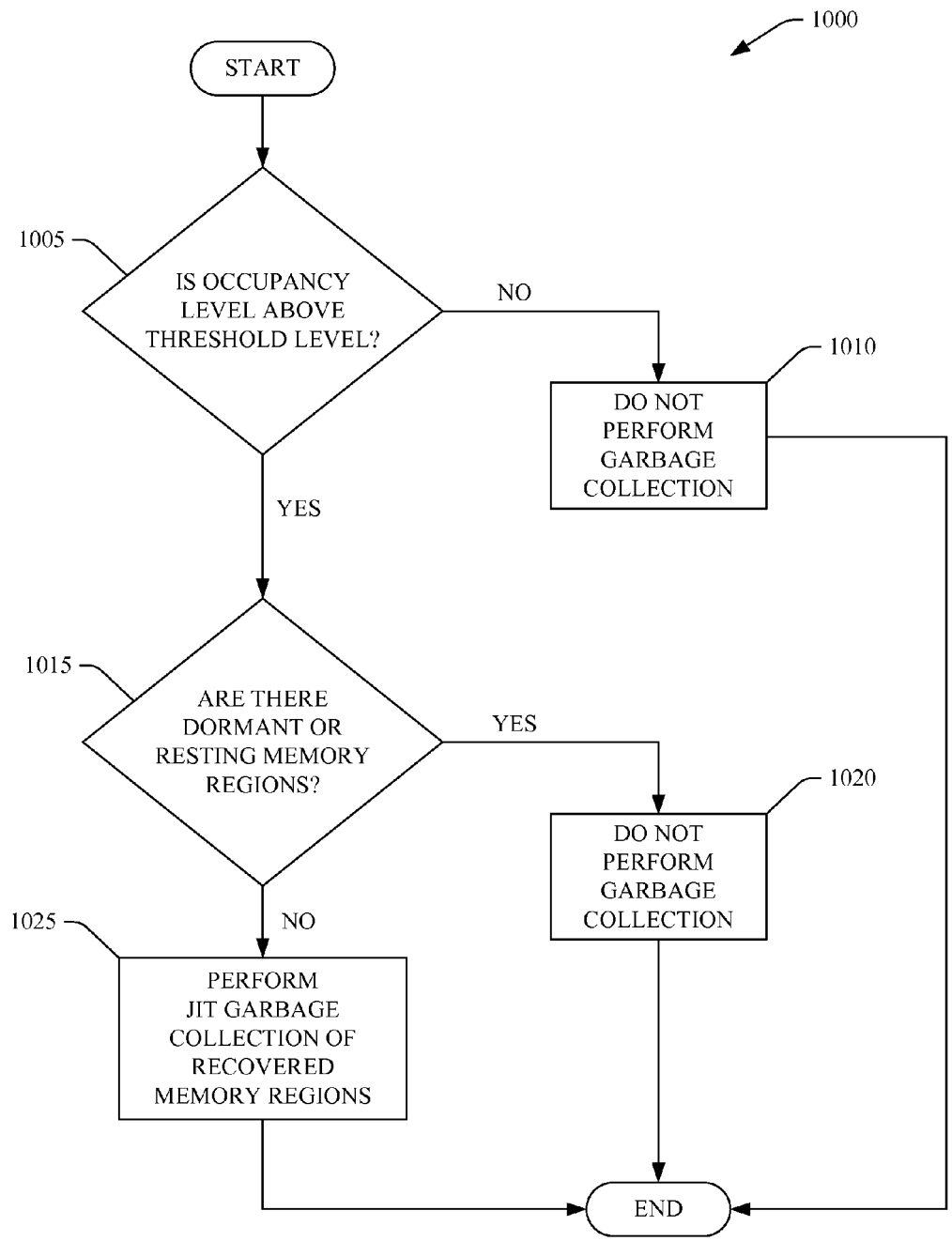
FIG. 10 illustrates a methodology that facilitates Just-In-Time reclamation of memory regions in a memory in accordance with an aspect of the subject matter disclosed herein.

FIG. 10 illustrated a methodology 1000 for managing memory region reclamation in accordance with the disclosed subject matter is illustrated. At reference numeral 1005, a determination can be made as to whether the occupancy level of the memory 130 (e.g., non-volatile memory, such as flash memory) is above a predetermined threshold level of occupancy. For example, a threshold occupancy level may be set at a level in a range of 70% to 100% of the memory 130 being occupied by data. If a determination is made that the occupancy level is not above the threshold level of occupancy, then, at reference numeral 1010, memory region reclamation (e.g., garbage collection) is not initiated. At this point, methodology 1000 ends. If, at reference numeral 1005, a determination is made that the occupancy level is above the threshold level, then, at reference numeral 1015, a determination can be made as to whether there are memory regions in the memory that are dormant or resting. If it is determined that there are memory regions that are dormant or resting, then at reference numeral 1020, memory region reclamation is not initiated. At this point, methodology 1000 ends. If, however, at reference numeral 1015, a determination is made that there are no regions that are dormant or resting, then, at reference numeral 1025, JIT garbage collection can be initiated to reclaim recovered memory regions in the memory. At this point, methodology 1000 ends.

Figure 11:
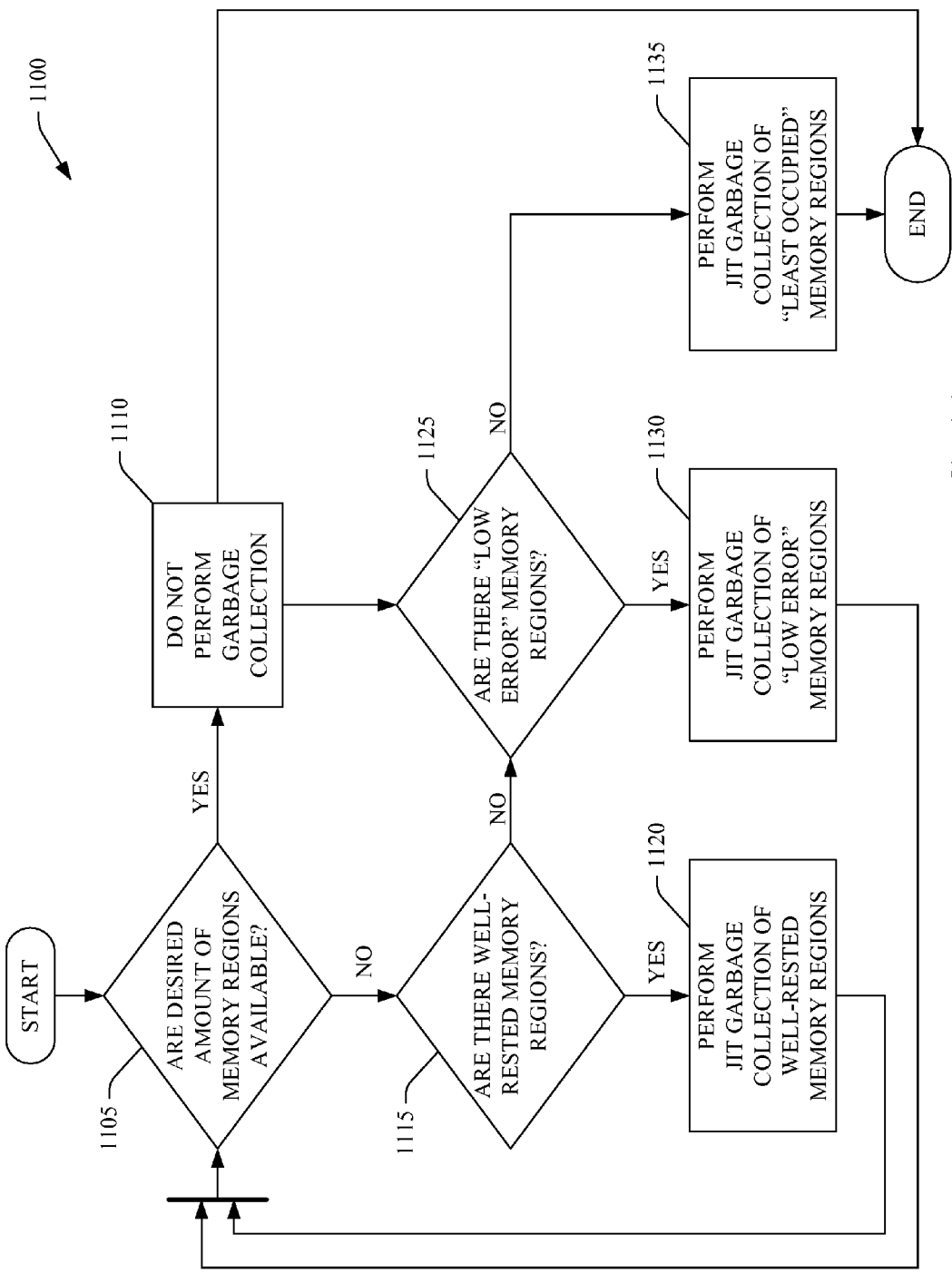
FIG. 11 illustrates an alternate methodology that facilitates Just-In-Time reclamation of memory regions in a memory in accordance with an aspect of the subject matter disclosed herein.

Turning to FIG. 11, a methodology 1100 for performing an alternate Just-In-Time reclamation of memory regions in memory 130 in accordance with the disclosed subject matter is illustrated. Methodology 1100 may be utilized when no memory regions are available (e.g., in an available pool of memory regions), and no recovered memory regions can be reclaimed, at the time an operation (e.g., write) is initiated, for example. At reference numeral 1105, a determination can be made as to whether a desired amount of memory regions are available or can be reclaimed. If the desired amount of memory regions are available or can be reclaimed, then, at reference numeral 1110, memory region reclamation (e.g., garbage collection) is not initiated, and methodology 1100 ends.

If, however, at reference numeral 1105, a determination is made that the desired amount of memory regions is not available or cannot be made available by reclaiming recovered regions, then, at reference numeral 1115, a determination can be made as to whether there are "well rested" memory regions that can be reclaimed. A "well rested" memory region can be a memory region that is in a resting phase, but has not yet reached the recovered phase, and has rested for a period of time that is above a predetermined threshold level of rest time. Alternatively, a "well rested" region can be a region that, as compared to other regions in the resting phase, has rested for a period of time that is greater than a number of other resting regions so as to place it above a predetermined threshold percentage of the resting memory regions with respect to the total number of resting memory regions. To continue the methodology 1100, if there are "well rested" memory regions, then, at reference numeral 1120, JIT memory region reclamation (e.g., JIT garbage collection) can be initiated and the "well rested" memory regions can be reclaimed and made available. After the "well rested" memory region are made available, methodology 1100 can be returned to 1105 to determine whether the desired amount of memory regions are available, now that the "well rested" memory regions have been made available.

If, however, at reference numeral 1115, a determination is made that there are no "well rested" memory regions that can be reclaimed, then, at reference numeral 1125, a determination can be made as to whether there are "low error" memory regions (even though not recovered) that can be reclaimed. If the determination is made that there are "low error" memory regions, then, at reference numeral 1130, JIT garbage collection can be initiated and such memory regions can be reclaimed and made available. After the "low error" memory regions are made available, methodology 1100 can be returned to 1105 to determine whether the desired amount of memory regions are available, now that the "low error" memory regions have been made available.

If, however, at reference numeral 1125, a determination is made that there are no "low error" memory regions that can be reclaimed, then, at reference numeral 1135, JIT garbage collection can be initiated to reclaim "least occupied" memory regions until the desired amount of memory regions have been reclaimed. At this point, methodology 1100 ends.

Figure 12:
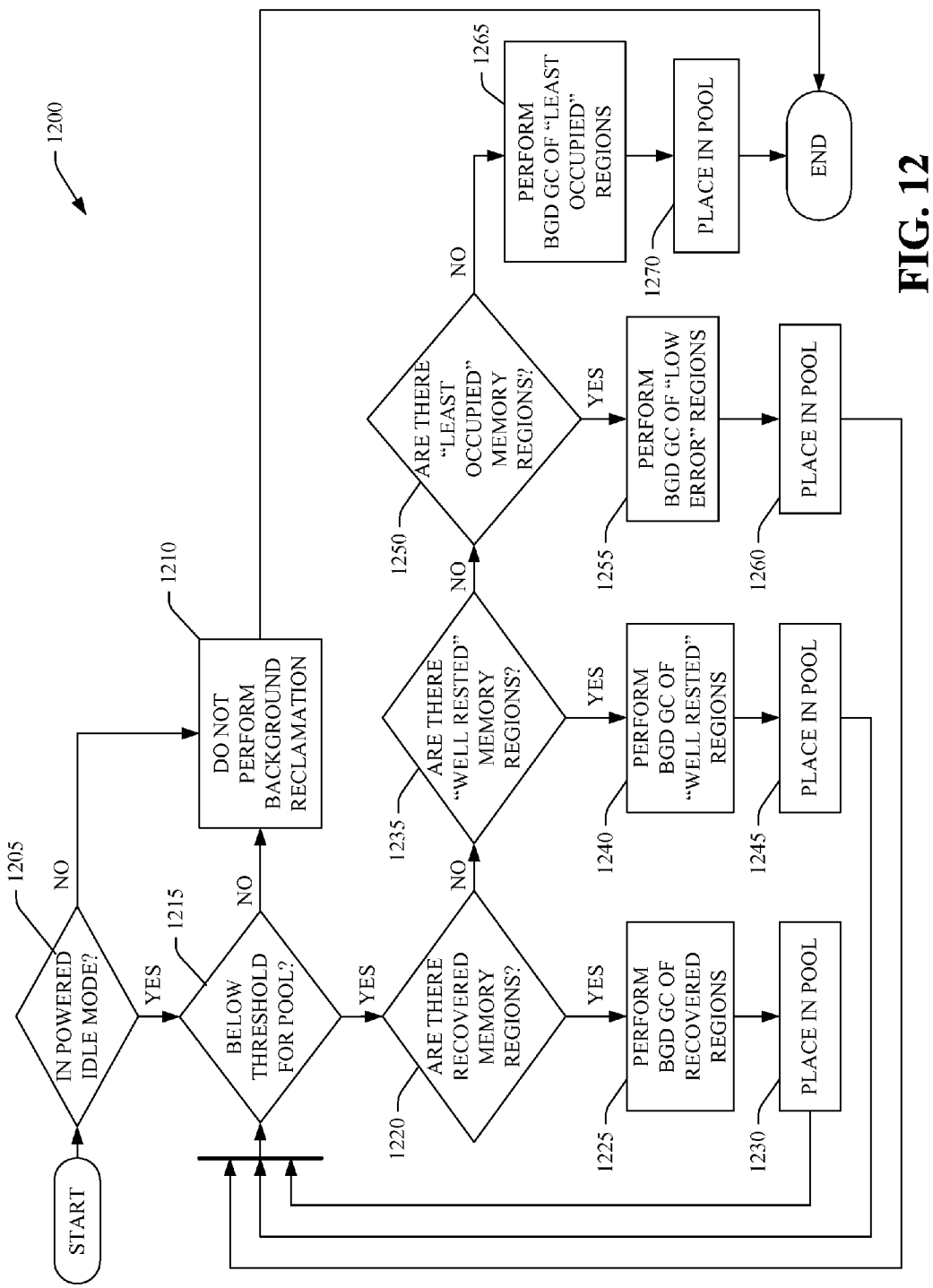
FIG. 12 illustrates a methodology that facilitates background reclamation of memory regions in a memory in accordance with an aspect of the subject matter disclosed herein.

Referring now to FIG. 12, a methodology 1200 for performing background reclamation of memory regions in accordance with the disclosed subject matter is illustrated. At reference numeral 1205, a determination can be made as to whether the memory 130 (e.g., non-volatile memory, such as flash memory) is in a powered idle mode, where powered idle mode can include instances where the memory, and/or the system or device in which the memory resides, is powered on. If the memory, or system or device, is not in the powered idle mode, then, at reference numeral 1210, background reclamation (e.g., background garbage collection) is not initiated, and methodology 1200 ends.

If, at reference numeral 1205, a determination is made that the memory, or system or device, is in the powered idle mode, then, at reference number 1215, a determination can be made as to whether the amount of memory regions in the available pool and/or burst pool is below a predetermined threshold level of memory regions. If it is determined that the amount of memory regions is not below the threshold level, then the methodology 1200 is directed to reference numeral 1210, background garbage collection is not initiated, and methodology 1200 ends. If, however, at reference numeral 1215, a determination is made that the amount of memory regions is below the threshold level of memory regions, then, at reference numeral 1220, a determination can be made as to whether there are recovered memory regions that can be reclaimed. If there are recovered memory regions, then, at reference numeral 1225, background garbage collection can be initiated and the recovered regions can be reclaimed. At reference numeral 1230, the reclaimed memory regions can be placed in the available pool and/or burst pool, as desired. After the recovered regions are placed in the appropriate pool(s), methodology 1200 can be returned to 1215 to determine whether the amount of memory regions in the available pool and/or burst pool is below the threshold level, now that the recovered regions have been reclaimed and placed in the available pool and/or burst pool.

If, however, at reference numeral 1220, a determination is made that there are no recovered memory regions that can be reclaimed, then, at reference numeral 1235, a determination can be made as to whether there are "well rested" memory regions that can be reclaimed. If the determination is made that there are "well rested" memory regions, then, at reference numeral 1240, background garbage collection can be initiated and such "well rested" memory regions can be reclaimed. At reference numeral 1245, the reclaimed memory regions can be placed in the available pool and/or burst pool. After the "well rested" memory regions are placed in the appropriate pool(s), methodology 1200 can be returned to reference numeral 1215 to determine whether the amount of memory regions in the available pool and/or burst pool is below the threshold level, now that the reclaimed "well rested" memory regions have been made placed in the appropriate pool(s).

If, however, at reference numeral 1235, a determination is made that there are no "well rested" memory regions that can be reclaimed, then, at reference numeral 1250, a determination can be made as to whether there are "low error" memory regions that can be reclaimed. If the determination is made that there are "low error" memory regions, then, at reference numeral 1255, background garbage collection can be initiated and such "low error" memory regions can be reclaimed. At reference numeral 1260, the reclaimed memory regions can be placed in the available pool and/or burst pool. After the reclaimed "low error" memory regions are placed in the appropriate pool(s), methodology 1200 can be returned to reference numeral 1215 to determine whether the amount of memory regions in the available pool and/or burst pool is below the threshold level, now that the reclaimed "low error" memory regions have been made placed in the appropriate pool(s).

If, however, at reference numeral 1250, a determination is made that there are no "low error" memory regions that can be reclaimed, then, at reference numeral 1265, background garbage collection can be initiated to reclaim "least occupied" memory regions until the threshold level for the available pool and/or burst pool is met. At reference numeral 1270, the reclaimed "least occupied" memory regions can be placed in the available pool and/or burst pool. At this point, methodology 1200 ends.

As utilized herein, terms "component," "system," "interface," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Artificial intelligence based systems (e.g., explicitly and/or implicitly trained classifiers) can be employed in connection with performing inference and/or probabilistic determinations and/or statistical-based determinations as in accordance with one or more aspects of the disclosed subject matter as described herein. As used herein, the term "inference," "infer" or variations in form thereof refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

For example, in accordance with an aspect of the disclosed subject matter, cycle interval management component 310 and/or normalization component 420, that can be included therein, can employ artificial intelligence to infer expected usage of an electronic device, an amount of time before a memory region in memory 130 attains a particular state (e.g., recovered state), and/or a normalization or multiplying factor to employ, based on current and historical evidence of usage of the electronic device. To further illustrate, based on historical information of electronic device usage, cycle interval management component 310 can infer future usage of the device, and can make inferences as to whether and when particular memory regions can be expected to be recovered. Further, cycle interval management component 310 can infer future memory region needs, based on historical memory usage, and can use such information to make decisions with regard to reclaiming memory regions and/or providing memory regions to the burst pool.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., CD, DVD . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Moreover, the word "exemplary" is used herein to mean serving as an example, instance, or illustration. Any aspect or design described herein as "exemplary" is not necessarily to be construed as preferred or advantageous over other aspects or designs.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

Figure 13:
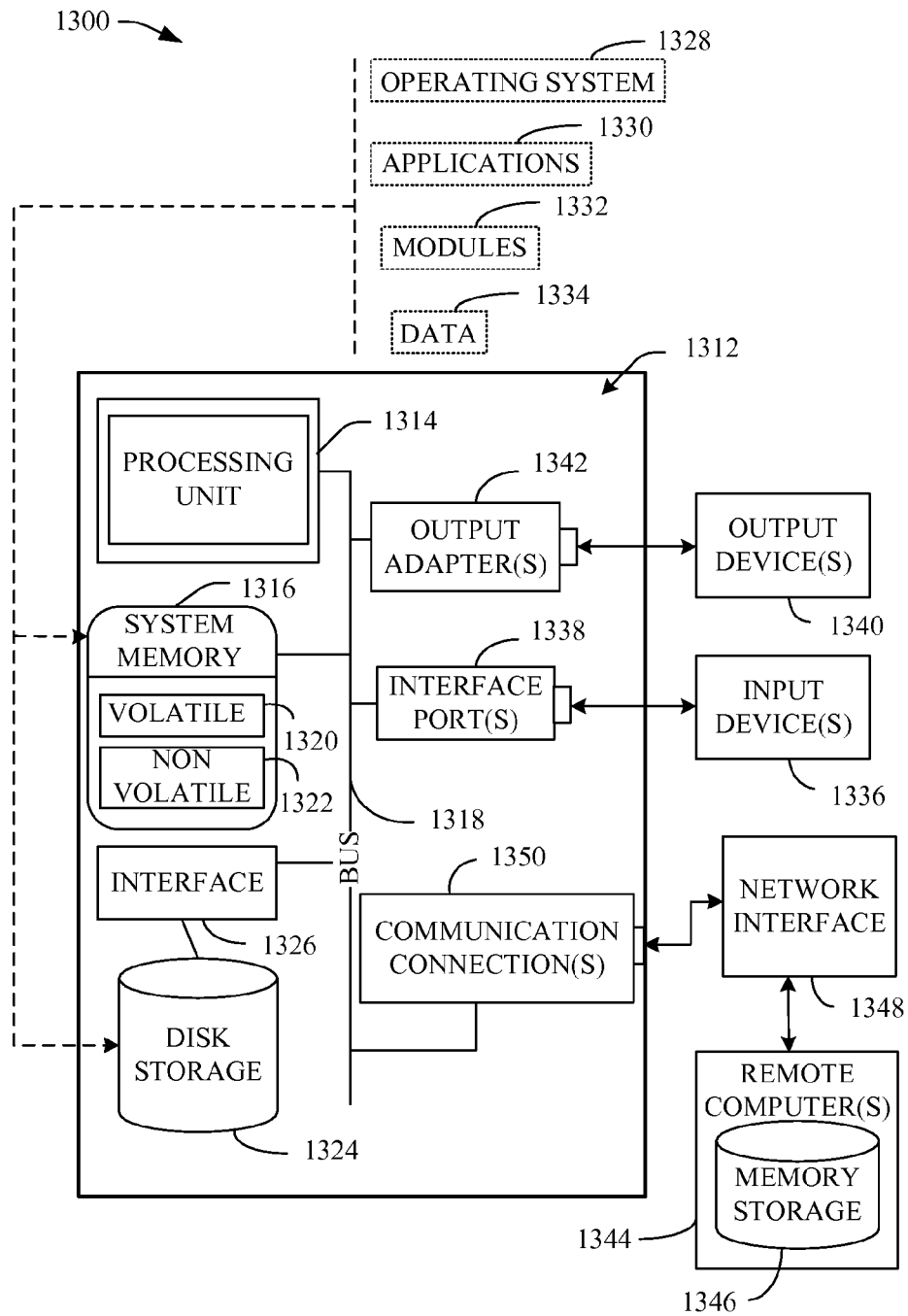
FIG. 13 is a schematic block diagram illustrating a suitable operating environment.
Figure 14:
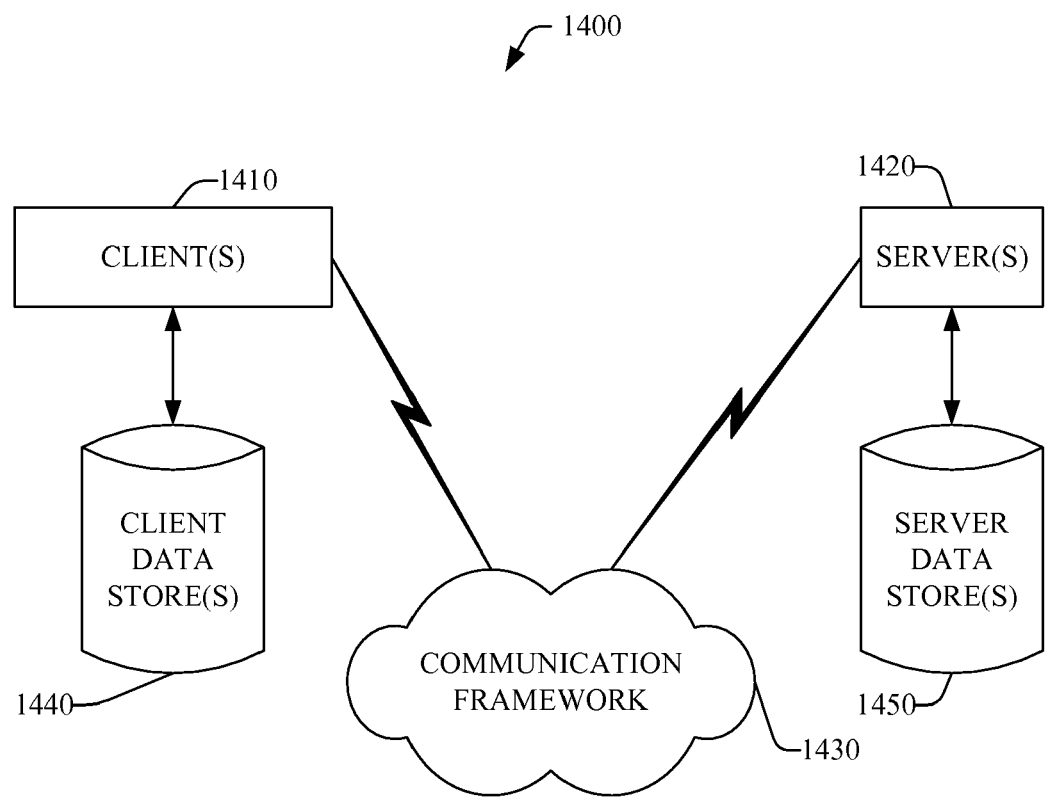
FIG. 14 is a schematic block diagram of a sample-computing environment.

In order to provide a context for the various aspects of the disclosed subject matter, FIGS. 13 and 14 as well as the following discussion are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone computers. In a distributed computing environment, program modules may be located in both local and remote memory storage devices.

With reference to FIG. 13, a suitable environment 1300 for implementing various aspects of the claimed subject matter includes a computer 1312. The computer 1312 includes a processing unit 1314, a system memory 1316, and a system bus 1318. The system bus 1318 couples system components including, but not limited to, the system memory 1316 to the processing unit 1314. The processing unit 1314 can be any of various available processors. Dual microprocessors and other multiprocessor architectures also can be employed as the processing unit 1314.

The system bus 1318 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1316 includes volatile memory 1320 and nonvolatile memory 1322. The basic input/output system (BIOS), containing the basic routines to transfer information between elements within the computer 1312, such as during start-up, is stored in nonvolatile memory 1322. By way of illustration, and not limitation, nonvolatile memory 1322 can include ROM, PROM, electrically programmable ROM (EPROM), electrically erasable programmable ROM (EEPROM), or flash memory. Volatile memory 1320 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1312 also includes removable/non-removable, volatile/non-volatile computer storage media. FIG. 13 illustrates, for example, a disk storage 1324. Disk storage 1324 includes, but is not limited to, devices like a magnetic disk drive, floppy disk drive, tape drive, Jaz drive, Zip drive, LS-100 drive, flash memory card, or memory stick. In addition, disk storage 1324 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1324 to the system bus 1318, a removable or non-removable interface is typically used, such as interface 1326.

It is to be appreciated that FIG. 13 describes software that acts as an intermediary between users and the basic computer resources described in the suitable operating environment 1300. Such software includes an operating system 1328. Operating system 1328, which can be stored on disk storage 1324, acts to control and allocate resources of the computer system 1312. System applications 1330 take advantage of the management of resources by operating system 1328 through program modules 1332 and program data 1334 stored either in system memory 1316 or on disk storage 1324. It is to be appreciated that the disclosed subject matter can be implemented with various operating systems or combinations of operating systems.

A user enters commands or information into the computer 1312 through input device(s) 1336. Input devices 1336 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1314 through the system bus 1318 via interface port(s) 1338. Interface port(s) 1338 include, for example, a serial port, a parallel port, a game port, and a universal serial bus (USB). Output device(s) 1340 use some of the same type of ports as input device(s) 1336. Thus, for example, a USB port may be used to provide input to computer 1312, and to output information from computer 1312 to an output device 1340. Output adapter 1342 is provided to illustrate that there are some output devices 1340 like monitors, speakers, and printers, among other output devices 1340, which require special adapters. The output adapters 1342 include, by way of illustration and not limitation, video and sound cards that provide a means of connection between the output device 1340 and the system bus 1318. It should be noted that other devices and/or systems of devices provide both input and output capabilities such as remote computer(s) 1344.

Computer 1312 can operate in a networked environment using logical connections to one or more remote computers, such as remote computer(s) 1344. The remote computer(s) 1344 can be a personal computer, a server, a router, a network PC, a workstation, a microprocessor based appliance, a peer device or other common network node and the like, and typically includes many or all of the elements described relative to computer 1312. For purposes of brevity, only a memory storage device 1346 is illustrated with remote computer(s) 1344. Remote computer(s) 1344 is logically connected to computer 1312 through a network interface 1348 and then physically connected via communication connection 1350. Network interface 1348 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1350 refers to the hardware/software employed to connect the network interface 1348 to the bus 1318. While communication connection 1350 is shown for illustrative clarity inside computer 1312, it can also be external to computer 1312. The hardware/software necessary for connection to the network interface 1348 includes, for exemplary purposes only, internal and external technologies such as, modems including regular telephone grade modems, cable modems and DSL modems, ISDN adapters, and Ethernet cards.

FIG. 14 is a schematic block diagram of a sample-computing environment 1400 with which the subject innovation can interact. The system 1400 includes one or more client(s)

1410. The client(s) 1410 can be hardware and/or software (e.g., threads, processes, computing devices). The system 1400 also includes one or more server(s) 1420. Thus, system 1400 can correspond to a two-tier client server model or a multi-tier model (e.g., client, middle tier server, data server), amongst other models. The server(s) 1420 can also be hardware and/or software (e.g., threads, processes, computing devices). The servers 1420 can house threads to perform transformations by employing the subject innovation, for example. One possible communication between a client 1410 and a server 1420 may be in the form of a data packet transmitted between two or more computer processes.

The system 1400 includes a communication framework 1430 that can be employed to facilitate communications between the client(s) 1410 and the server(s) 1420. The client(s) 1410 are operatively connected to one or more client data store(s) 1440 that can be employed to store information local to the client(s) 1410. Similarly, the server(s) 1420 are operatively connected to one or more server data store(s) 1450 that can be employed to store information local to the servers 1420.

What has been described above includes examples of aspects of the claimed subject matter. It is, of course, not possible to describe every conceivable combination of components or methodologies for purposes of describing the claimed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system that facilitates management and lifetime optimization of a memory, comprising:
   the memory comprising a plurality of memory regions;
   a processor;
   a computer readable storage medium operationally coupled to the processor and storing computer executable instructions, the computer executable instructions, when executed by the processor, implement components comprising:
   a cycle interval management component that compiles a history of usage and operating conditions of a memory region of the plurality of memory regions and, based at least on the history of usage and operating conditions, identifies an additional period of time for which the memory region should be rested following an erase cycle, wherein the additional period of time the memory should be rested is in addition to a period of time the memory region rests after an erase cycle on the memory region is performed, and
   a memory management component that determines if an operation is to be performed on the memory region based in part on the additional period of time for which the memory region should be rested.

2. The system of claim 1, the operation is one of a write operation, a reclaiming operation, or an erase cycle.

3. The system of claim 2, further comprising a data management component that facilitates placing data associated with the write operation in one or more memory regions by employing at least one of address translation, peanut-butter wear leveling where data is striped through memory regions, in-order wear leveling, pseudo-wear leveling, dynamic wear leveling, or static wear leveling, or a combination thereof.

4. The system of claim 2, the reclaiming operation is one of a just-in-time memory region reclamation, a background memory region reclamation, or an on-demand memory region reclamation.

5. The system of claim 4, the just-in-time memory region reclamation is performed if an amount of empty space in the memory is below a predetermined threshold level.

6. The system of claim 1, the memory management component determines if the operation is to be performed on the memory region based in part on a number of programming errors associated with the memory region.

7. The system of claim 1, further comprising a memory region reclamation component that identifies a memory region of the plurality of memory regions to be reclaimed, distinguishes between valid and invalid data in the memory region, facilitates the transfer of valid data from the memory region to another memory region of the plurality of memory regions, and facilitates an erase of the memory region to reclaim the memory region.

8. The system of claim 1, the cycle interval management component tracks an amount of time the memory, or a device in which the memory resides, is powered on; records the amount of time; and generates a normalized amount of time, where the amount of time is normalized to account for periods of time where the memory or the device is not powered on.

9. The system of claim 1, the cycle interval management component facilitates placement of information associated with an erase of a memory region in at least a list, a table, or a tree, or a combination thereof.

10. The system of claim 1, the memory is non-volatile memory, comprising flash memory.

11. A device comprising the system of claim 1, the device further comprising at least one of a computer, a personal digital assistant, a cellular phone, a digital phone, an answering machine, a video device, a television, a digital versatile diskplayer/recorder, a music player/recorder, an MP3 player, a digital recorder, a digital camera, a microwave oven, an electronic organizer, an electronic toy, an electronic game, a scanner, a reader, a printer, a copy machine, or a facsimile machine.

12. The system of claim 1, further comprising a burst pool component that facilitates maintaining a burst pool that comprises a number of memory regions associated with the memory that are placed in the burst pool and are made available when there are no memory regions left in an available pool of memory regions associated with the memory.

13. A method for managing and optimizing a memory, comprising:
   employing a processor executing computer executable instructions stored on a computer readable storage medium to implement the following acts:
   compiling a history of usage and operating conditions for at least one memory region of a plurality of memory regions in the memory;
   determining a period of time for which the at least one memory region should be rested following an erase cycle in which the period of time is in addition to a rest period for the memory region in a dormant state, the dormant state is when the memory region is in the process of erasing or when the erase of the memory region has just been completed;
   initiating an operation associated with the memory, the operation is one of a write operation, a memory region reclaiming operation, or an erase cycle; and determining the at least one memory region of the plurality of memory regions in the memory on which the operation is to be performed based in part on the determined rest time period in addition to a rest period of the at least one memory region in a dormant state.

14. The method of claim 13, further comprising:
selecting the at least one memory region; and
performing the operation on the at least one memory region.

15. The method of claim 13, further comprising:
determining the at least one memory region on which the operation is to be performed based in part on one of a number of programming errors or an average number of programming errors per erase cycle, associated with the memory region.

16. The method of claim 13, further comprising:
selecting a recovered memory region with a number of programming errors that is below a predetermined threshold value, if there is such recovered memory region in at least one of an available pool or a burst pool, where the operation is a write operation;
selecting a well-rested erased memory region with a number of programming errors that is below a predetermined threshold value, if there is such well-rested erased memory region in at least one of an available pool or a burst pool, where the operation is a write operation;
selecting an erased memory region with a number of programming errors that is below a predetermined threshold value, if there is no recovered memory region or well-rested erased memory region with a number of programming errors that is below a predetermined threshold value in the at least one of the available pool or the burst pool, and if there is an erased memory region in the at least one of the available pool or the burst pool; and
selecting an empty memory region with a number of programming errors that is at or above a predetermined threshold value, if there is no recovered memory region, well-rested erased memory region, or erased memory region with a number of programming errors that is below a predetermined threshold value in the at least one of the available pool or the burst pool.

17. The method of claim 16, further comprising:
reclaiming one or more memory regions, if there are no empty memory regions in the at least one of the available pool or the burst pool.

18. The method of claim 13, further comprising:
initiating a just-in-time memory region reclamation if the number of available memory regions is below a predetermined threshold level;
reclaiming a memory region of the plurality of the memory regions if the memory region is well rested, if one or more such well-rested memory region are available;
reclaiming a memory region of the plurality of the memory region if the memory region has a low number of programming errors, if one or more such low-error memory region are available and if no well-rested memory region is available; and
reclaiming a memory region of the plurality of the memory region if the memory region has a low amount of valid data stored therein, if one or more such memory region with low amount of valid data are available, and if a well-rested memory region and a low-error memory region are not available.

19. A system for managing memory regions in a memory, comprising:
a processor;
a computer readable storage medium storing computer executable instructions, the computer executable instructions, when executed by the processor, implement components comprising:
means for selecting, by the processor, a type of data placement to be utilized during a write operation;
means for compiling, by the processor, a usage and operating condition history of at least one memory region in a plurality of memory regions in the memory;
means for identifying, by the processor, a default period of time for which at least one memory region is rested following an erase cycle, such default period of time relates to a usage and operating condition history;
means for determining, by the processor, an additional period of time for which the at least one memory region should be rested following an erase cycle based upon the usage and operating condition history, such additional period of time is in addition to the default period of time for which at least one memory region is rested following an erase cycle;
means for calculating, by the processor, an amount of time since an erase cycle has been performed on the at least one memory region;
means for determining, by the processor, whether the at least one memory region has rested for the determined rest period since the erase cycle was performed on the at least one memory region; and
means for choosing, by the processor, at least one memory region of the plurality of memory regions on which to execute the write operation based in part on whether the at least one memory region has been sufficiently rested.

20. The system of claim 19, further comprising:
means for reclaiming at least one memory region of the plurality of memory regions based in part on at least one of a period of time since an erase cycle has been performed on the at least one memory region or a number of programming errors associated with the at least one memory region, or a combination thereof;
means for determining if an occupancy level associated with the memory exceeds a predetermined threshold level; and
means for determining a type of memory region reclamation to perform based in part on whether the occupancy level exceeds the predetermined threshold level.

* * * * *